United States Patent
Sung et al.

(10) Patent No.: US 9,741,623 B2
(45) Date of Patent: Aug. 22, 2017

(54) DUAL LINER CMOS INTEGRATION METHODS FOR FINFET DEVICES

(71) Applicant: GLOBALFOUNDRIES Inc., Grand Cayman (KY)

(72) Inventors: Min Gyu Sung, Latham, NY (US); Chanro Park, Clifton Park, NY (US); Ruilong Xie, Niskayuna, NY (US); Hoon Kim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 87 days.

(21) Appl. No.: 14/828,652

(22) Filed: Aug. 18, 2015

(65) Prior Publication Data

US 2017/0053835 A1    Feb. 23, 2017

(51) Int. Cl.
*H01L 21/8238* (2006.01)
*H01L 27/092* (2006.01)

(52) U.S. Cl.
CPC ......... *H01L 21/823821* (2013.01); *H01L 21/823807* (2013.01); *H01L 27/0924* (2013.01)

(58) Field of Classification Search
CPC ..... H01L 21/823821; H01L 21/823807; H01L 27/0924
USPC .......................................... 257/369; 438/424
See application file for complete search history.

(56) References Cited

U.S. PATENT DOCUMENTS

| | | | |
|---|---|---|---|
| 9,425,106 B1* | 8/2016 | Xie | H01L 21/823431 |
| 2014/0315371 A1* | 10/2014 | Cai | H01L 21/823821 |
| | | | 438/424 |
| 2015/0200128 A1* | 7/2015 | Jacob | H01L 21/76224 |
| | | | 438/424 |
| 2016/0093619 A1* | 3/2016 | Cheng | H01L 27/0924 |
| | | | 257/369 |
| 2016/0093726 A1* | 3/2016 | Ching | H01L 29/785 |
| | | | 257/192 |
| 2016/0190240 A1* | 6/2016 | Fang | H01L 29/0649 |
| | | | 257/506 |
| 2016/0372470 A1* | 12/2016 | Ok | H01L 27/0924 |
| 2016/0379982 A1* | 12/2016 | You | H01L 29/0657 |
| | | | 257/369 |

* cited by examiner

*Primary Examiner* — Cuong Q Nguyen
*Assistant Examiner* — Tong-Ho Kim
(74) *Attorney, Agent, or Firm* — Amerson Law Firm, PLLC

(57) ABSTRACT

One illustrative method disclosed herein includes, among other things, performing a first trench etching process to define an upper portion of a first fin for an NFET device and an upper portion of a second fin for a PFET device, performing a first conformal deposition process to form a conformal etch stop layer around the upper portion of both the first and second fins, with the NFET device masked, performing a second trench etching process to define a lower portion of the second fin, and performing a second conformal deposition process to form a conformal protection layer adjacent the upper portion of the second fin and on sidewalls of the lower portion of the second fin.

21 Claims, 22 Drawing Sheets

DUAL LINER CMOS INTEGRATION METHODS FOR FINFET DEVICES

BACKGROUND OF THE INVENTION

1. Field of the Invention

Generally, the present disclosure relates to the manufacturing of semiconductor devices, and, more specifically, to various methods of using a dual liner approach for forming CMOS integrated circuit products that employ FinFET devices, and the resulting device structures.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. A so-called metal oxide field effect transistor (MOSFETs or FETs) is one commonly employed circuit element that is found on integrated circuit products. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

A conventional FET is a planar device that typically includes a source region, a drain region and a channel region that is positioned between the source region and the drain region, and a gate electrode positioned above the channel region. To improve the operating speed of planar FETs, and to increase the density of planar FETs on an integrated circuit product, device designers have greatly reduced the physical size of planar FETs over the past decades. More specifically, the channel length of planar FETs has been significantly decreased, which has resulted in improving the switching speed and in lowering operation currents and voltages of planar FETs. However, decreasing the channel length of a planar FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the planar FET as an active switch is degraded.

In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12. The simplistically depicted device 10 includes three illustrative fins 14, an isolation material 15, a gate structure 16, a sidewall spacer 18 and a gate cap layer 20. The gate structure 16 is typically comprised of a layer of insulating material (not separately shown), e.g., a layer of high-k insulating material, and one or more conductive material layers that serve as the gate electrode for the device 10. In this example, the fins 14 are comprised of a substrate fin portion 14A and an alternative fin material portion 14B. The substrate fin portion 14A may be made of silicon, i.e., the same material as the substrate, and the alternative fin material portion 14B may be made of a material other than the substrate material, for example, silicon-germanium. The fins 14 have a three dimensional configuration: a height H, a width W and an axial length L. The axial length L corresponds to the direction of current travel in the device 10 when it is operational, i.e., the gate-length direction. The portions of the fins 14 covered by the gate structure 16 are the channel regions of the FinFET device 10. In a conventional process flow, the portions of the fins 14 that are positioned outside of the spacers 18, i.e., in the source/drain regions of the device 10, may be increased in size or even merged together (not shown in FIG. 1A) by performing one or more epitaxial growth processes. The process of adding epi material on the portions of the fins 14 in the source/drain regions of the device 10 is performed to reduce the resistance of source/drain regions and/or make it easier to establish electrical contact to the source/drain regions.

Unlike a planar FET, in a FinFET device, a channel is formed perpendicular to a surface of the semiconducting substrate so as to increase the drive current per footprint of the device. Also, in a FinFET, the improved gate control through multiple gates on a narrow, fully-depleted semiconductor fin significantly reduces the short channel effects. When an appropriate voltage is applied to the gate electrode of a FinFET device, the surfaces (and the inner portion near the surface) of the fins 14, i.e., the vertically oriented sidewalls and the top upper surface of the fin (for a tri-gate device), form a surface inversion layer or a volume inversion layer that contributes to current conduction. In a FinFET device with a single fin, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance, capability and reliability of such devices. Device designers are currently investigating using alternative semiconductor materials, such as so-called SiGe, Ge and III-V materials, to manufacture FinFET devices which are intended to enhance the performance capabilities of such devices, e.g., to enable low-voltage operation without degrading their operating speed. FIGS. 1B-1E depict one illustrative problem that may be encountered when forming FinFET devices comprised of alternative fin material.

FIG. 1B depicts an illustrative FinFET 30 at a point in fabrication where several process operations have been performed. More specifically, a layer of alternative semiconductor material 38 (e.g., SiGe or Ge) was initially formed on the substrate 12, and a patterned masking layer 32 was formed above the alternative semiconductor material 38. Thereafter, one or more etching processes were performed through the patterned masking layer 32 to form a plurality of fin-formation trenches 34 that extend into the substrate 12. These process operations result in the definition of five illustrative fins comprised of a substrate fin portion 36 and an alternative material portion 38. Next, a thin liner layer 40 (e.g., silicon nitride) was formed on the fins and in the trenches 34 by performing a conformal deposition process, e.g., atomic layer deposition (ALD) or chemical vapor deposition (CVD). Next, a layer of insulating material 42 (e.g., silicon dioxide) was blanket-deposited so as to overfill the trenches 34.

FIG. 1C depicts the device 30 after a chemical mechanical planarization (CMP) process was performed that stops on the patterned masking layer 32. FIG. 1D depicts the device 30 after a recess etching process (i.e., a so-called "fin reveal" etching process) was performed to recess the layer of insulating material 42 to a desired level such that the desired amount of the fin, i.e., the alternative material portion 38, is exposed.

FIG. 1E depicts the device 30 after an etching or cleaning process was performed to clear the exposed fin of the silicon nitride liner 40 and the patterned masking layer 32. Any remnants of silicon dioxide that may be present on the fin at this time (e.g., a pad oxide) may also be removed at this point in time. Unfortunately, the alternative fin material 38 may also be attacked during these etching/cleaning process operations and portions of the alternative fin material 38 may be undesirably consumed during these process operations, as reflected by the reduced-size alternative fin material 38R shown in FIG. 1E. Such undesirable consumption may adversely impact device performance characteristics.

The present disclosure is directed to various methods of using a dual liner approach for forming CMOS integrated circuit products that employ FinFET devices, and the resulting device structures, that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of using a dual liner approach for forming CMOS integrated circuit products that employ FinFET devices, and the resulting device structures. One illustrative method disclosed herein includes, among other things, forming a patterned etch mask above a semiconductor substrate, performing at least one first trench etching process through the patterned etch mask to define an upper portion of a first fin for an NFET device and an upper portion of a second fin for a PFET device, performing a first conformal deposition process to form a conformal etch stop layer around the upper portion of both the first and second fins, and forming a PFET device etch mask that covers the NFET device and exposes the PFET device. In this example, the method also includes, with the PFET device etch mask in position, performing at least one second trench etching process through the patterned etch mask to define a lower portion of the second fin and to remove portions of the conformal etch stop layer, and performing a second conformal deposition process to form a conformal protection layer on remaining portions of the conformal etch stop layer adjacent the upper portion of the second fin and on sidewalls of the lower portion of the second fin.

One illustrative integrated circuit product disclosed herein includes, among other things, an NFET FinFET device comprised of a first fin made entirely of a first semiconductor material, a PFET FinFET device comprised of a second fin having an upper portion and a lower portion, the lower portion being made of the first semiconductor material, the upper portion being made of a second semiconductor material that is different than the first semiconductor material, and a silicon nitride liner positioned on and in contact with the lower portion of the second fin, wherein the silicon nitride liner layer is not present adjacent an upper portion of the second fin or any portion of the first fin.

BRIEF DESCRIPTION OF THE DRAWINGS

The disclosure may be understood by reference to the following description taken in conjunction with the accompanying drawings, in which like reference numerals identify like elements, and in which.

Figure 1A:
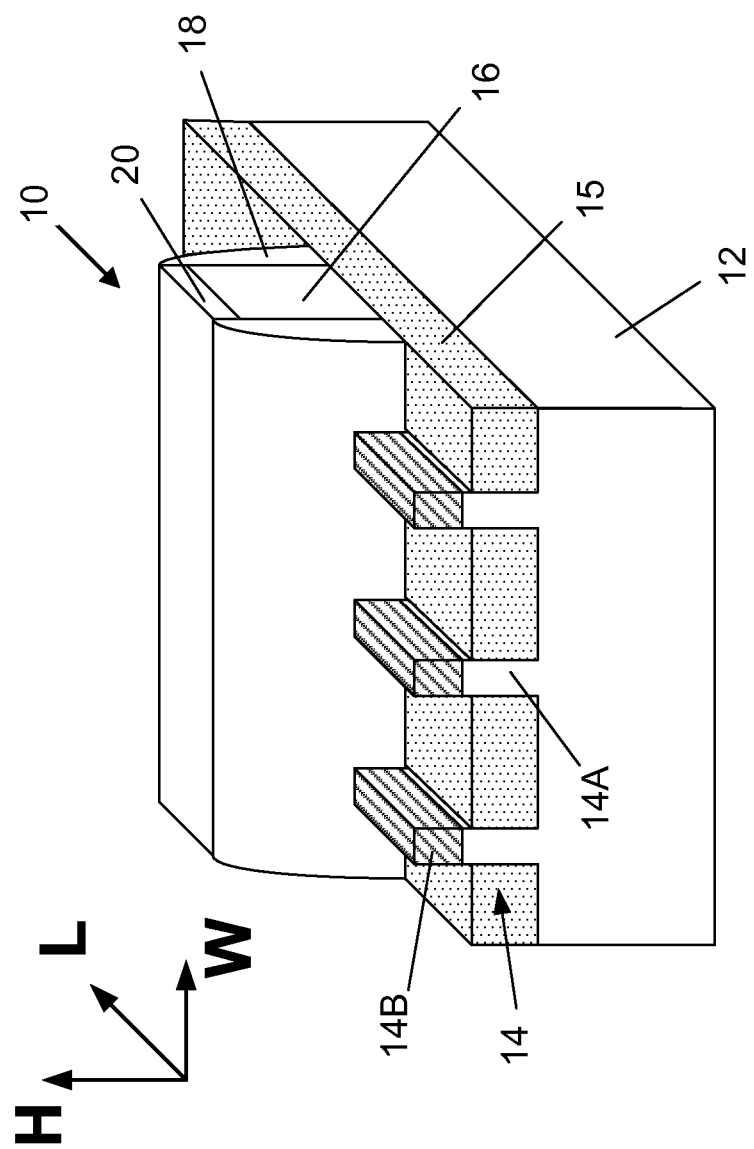
FIGS. 1A-1E depict one illustrative prior art method of forming fins for FinFET devices wherein the fin is comprised of an alternative semiconductor material.
Figure 1B:
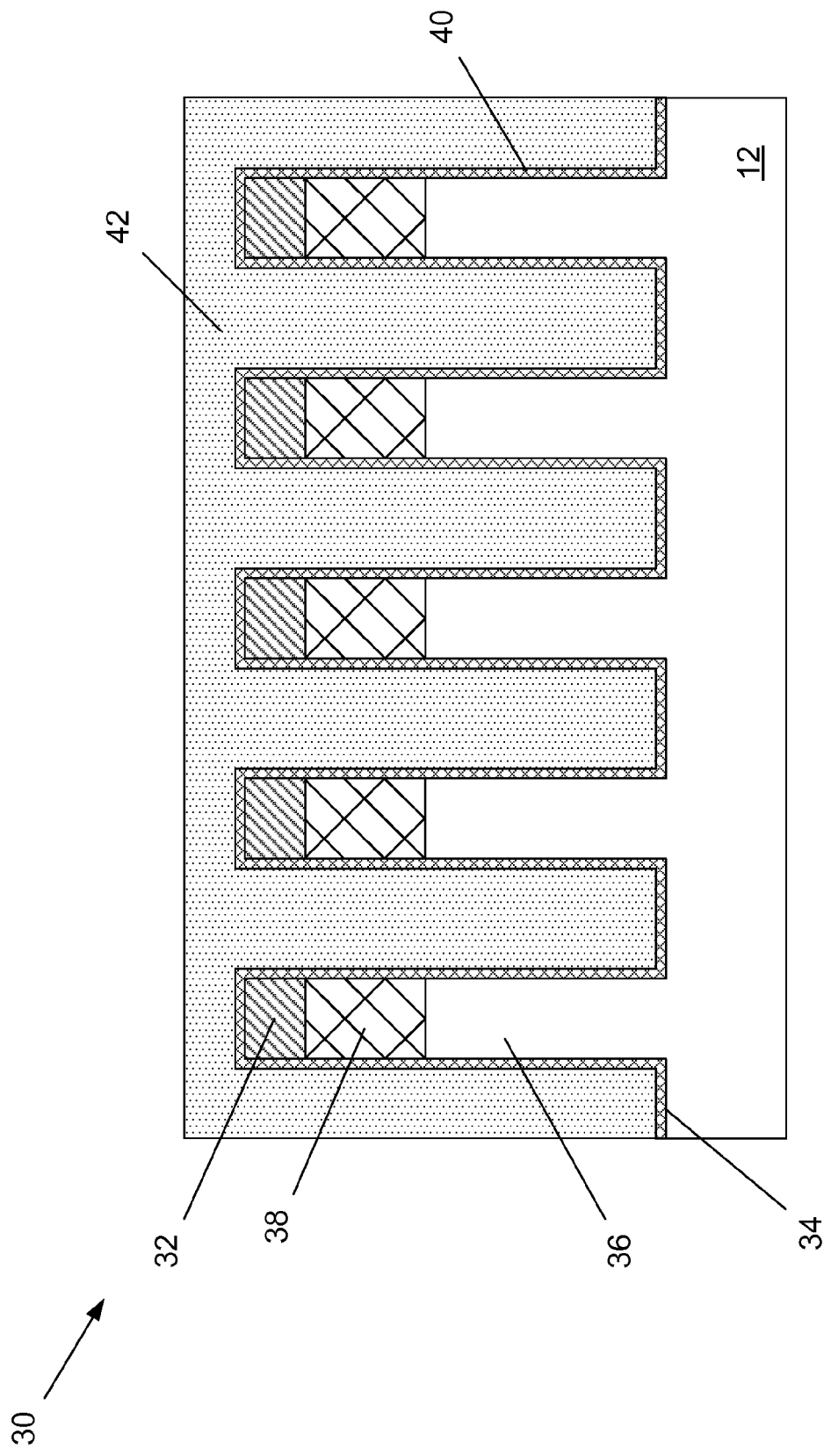
Figure 1C:
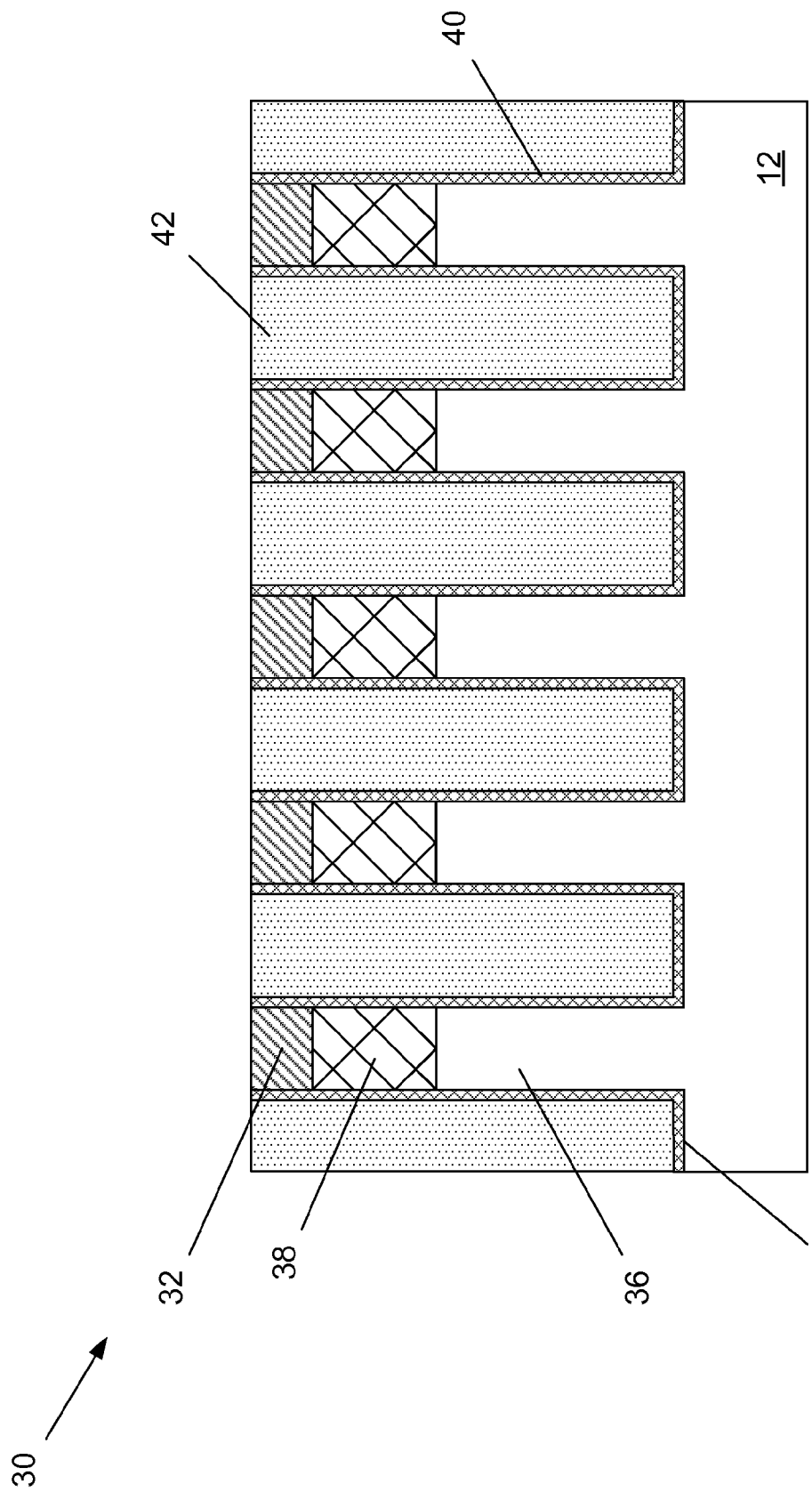
Figure 1D:
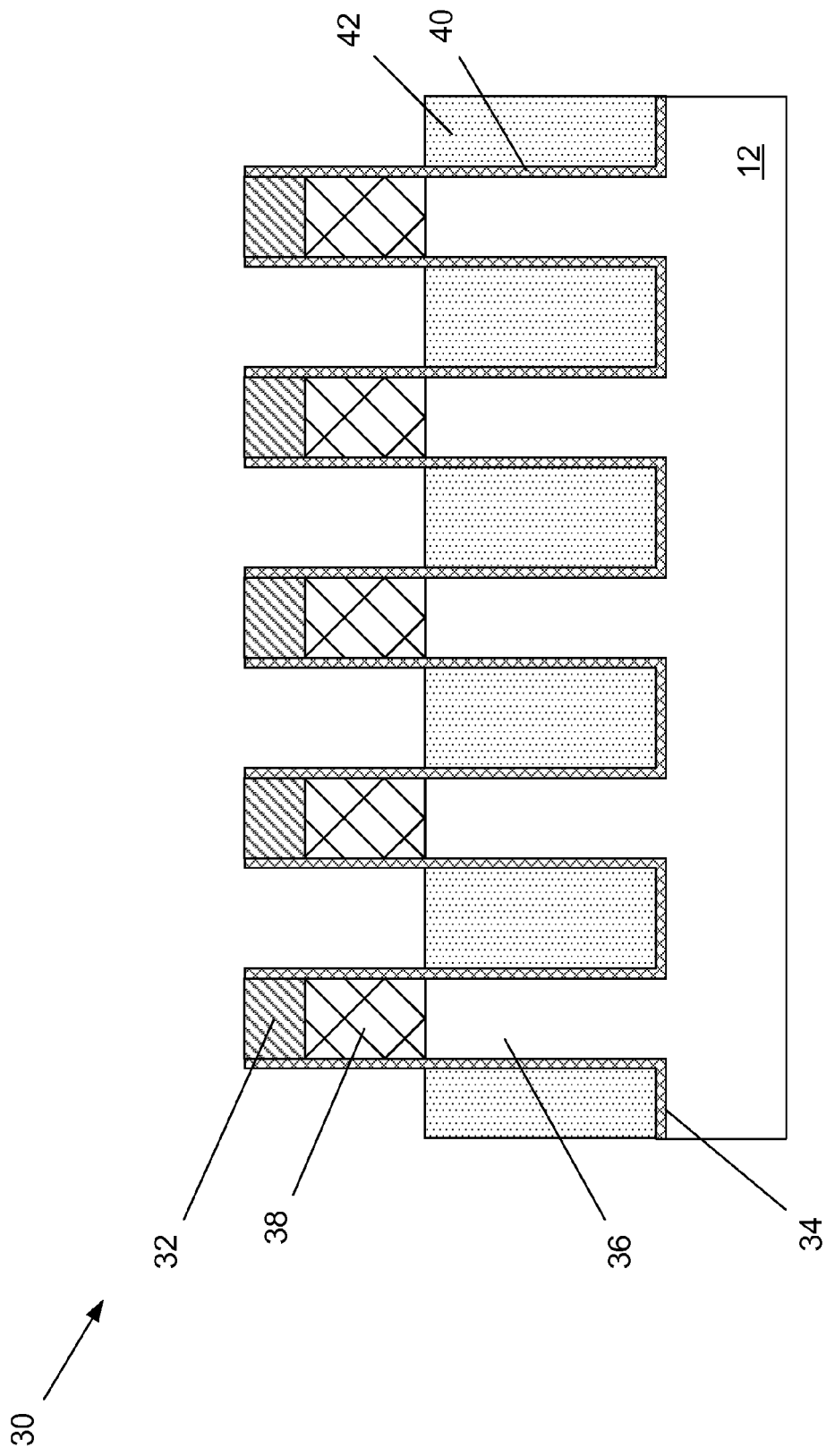
Figure 1E:
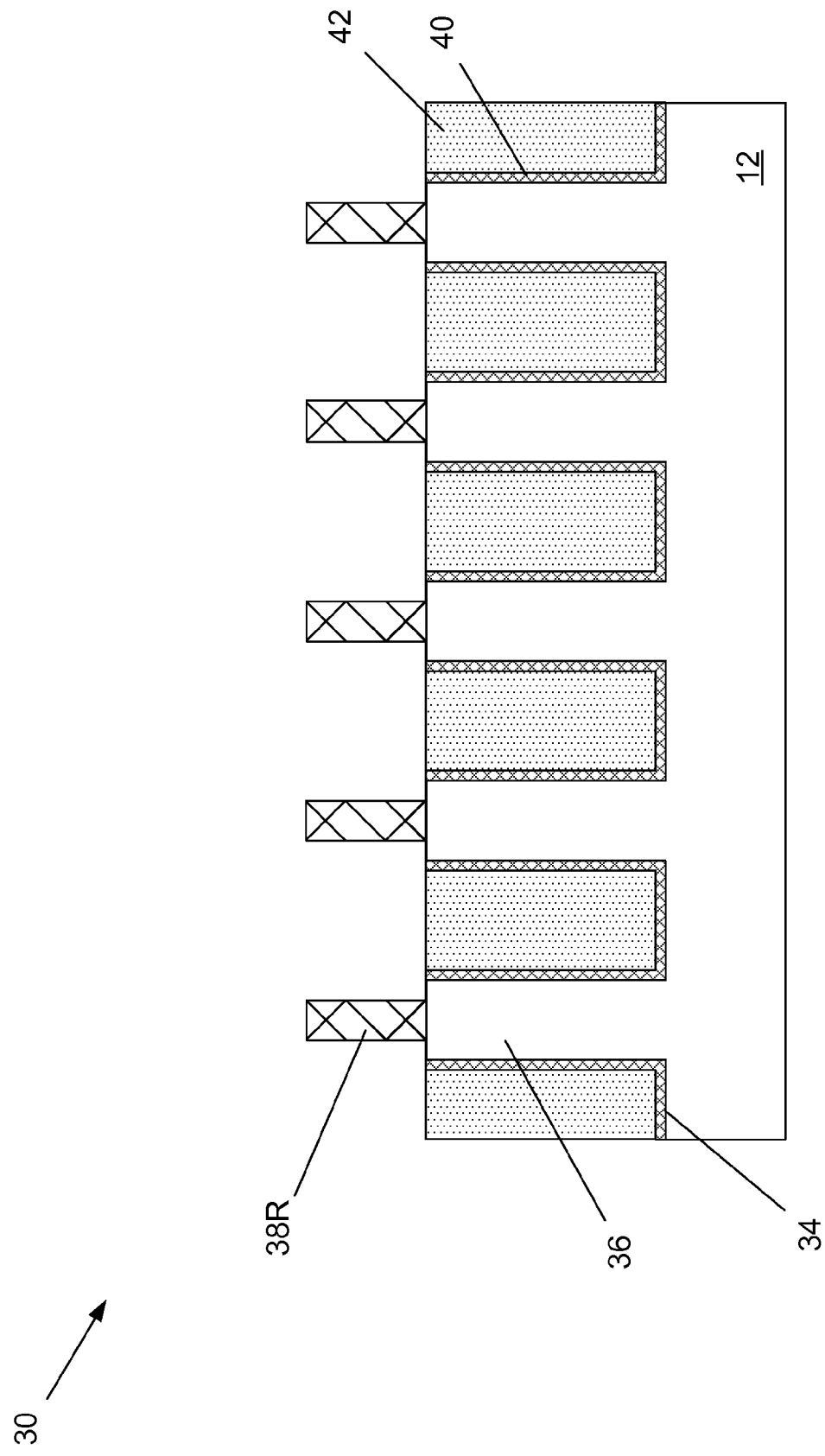

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of using a dual liner approach for forming CMOS integrated circuit products that employ FinFET devices, and the resulting device structures. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

The integrated circuit products 100 depicted herein are formed in and on a semiconducting substrate 102, such as a bulk substrate or an active layer of an SOI type substrate. The substrate 102 may be made of silicon or it may be made of materials other than silicon. Thus, the terms "substrate" or "semiconducting substrate" should be understood to cover all forms of all semiconductor materials. As will be recognized by those skilled in the art after a complete reading of the present application, the illustrative integrated circuit product 100 may be comprised of a plurality of N-type FinFET devices and a plurality of P-type FinFET devices, i.e., the product 100 is a CMOS based product.

As will be appreciated by those skilled in the art after a complete reading of the present application, various doped regions, e.g., source/drain regions, halo implant regions, well regions and the like, for the devices are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
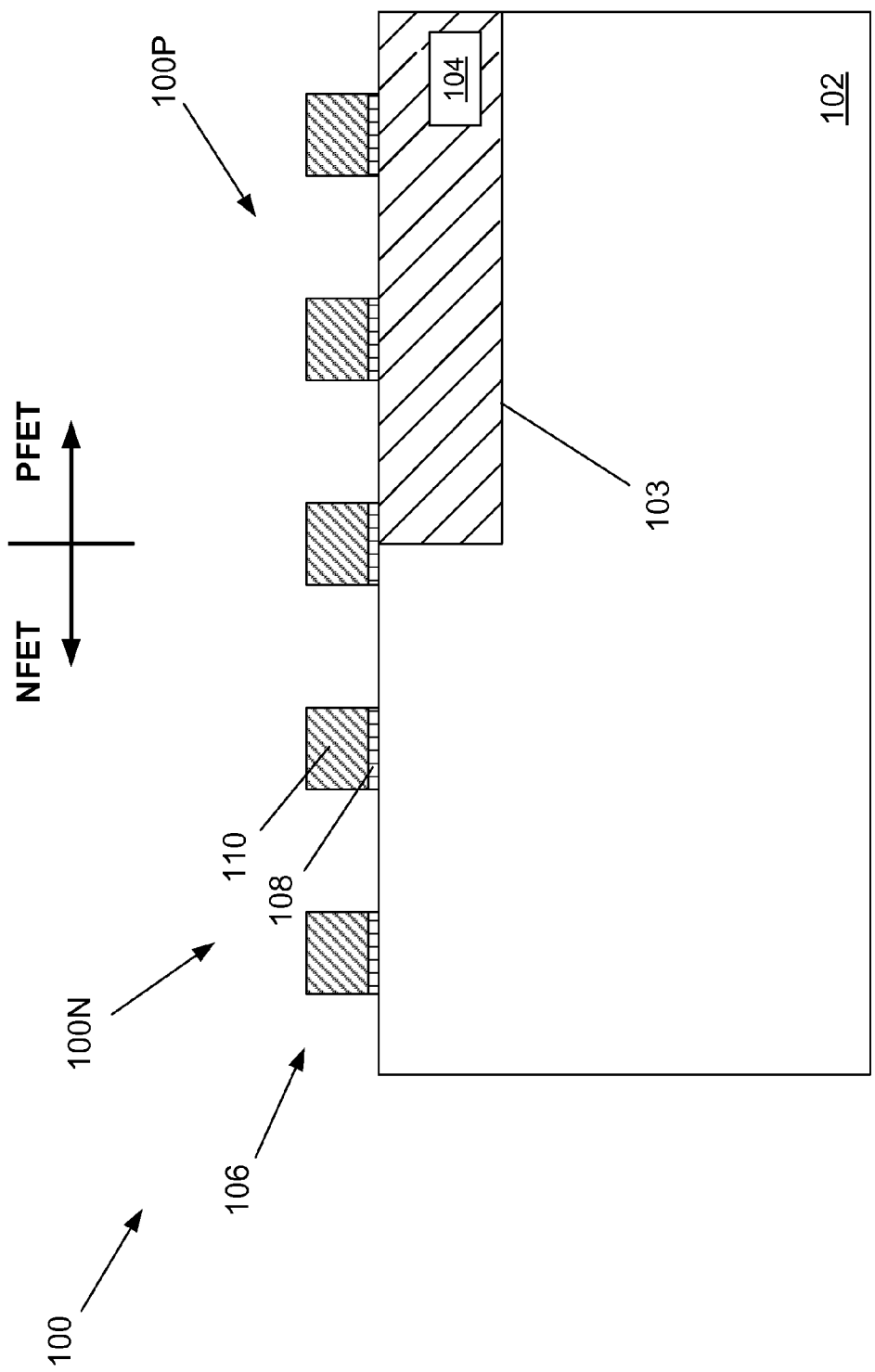
FIGS. 2A-2Q depict various illustrative methods disclosed herein of using a dual liner approach for forming CMOS integrated circuit products that employ FinFET devices, and the resulting device structures.
Figure 2B:
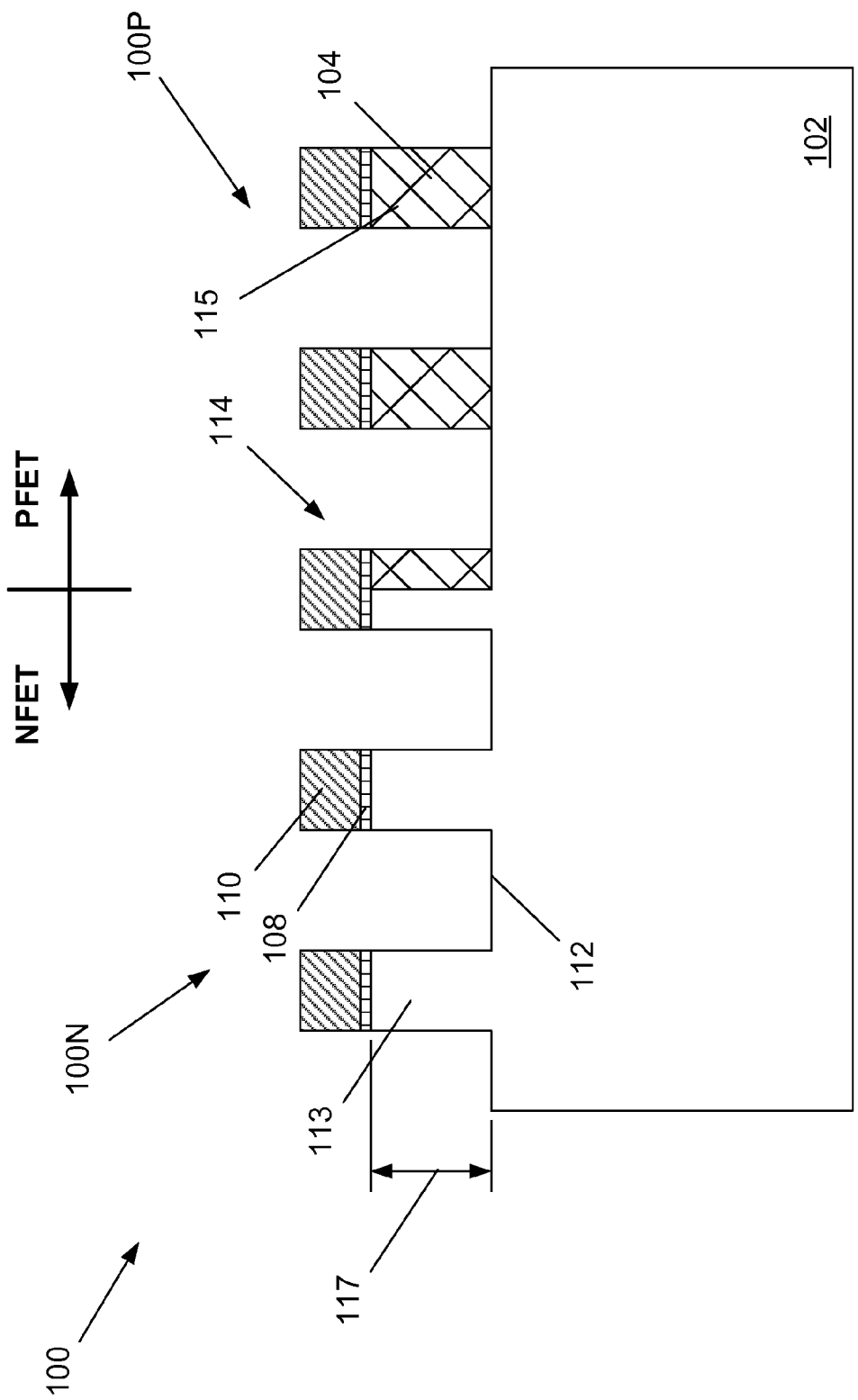
Figure 2C:
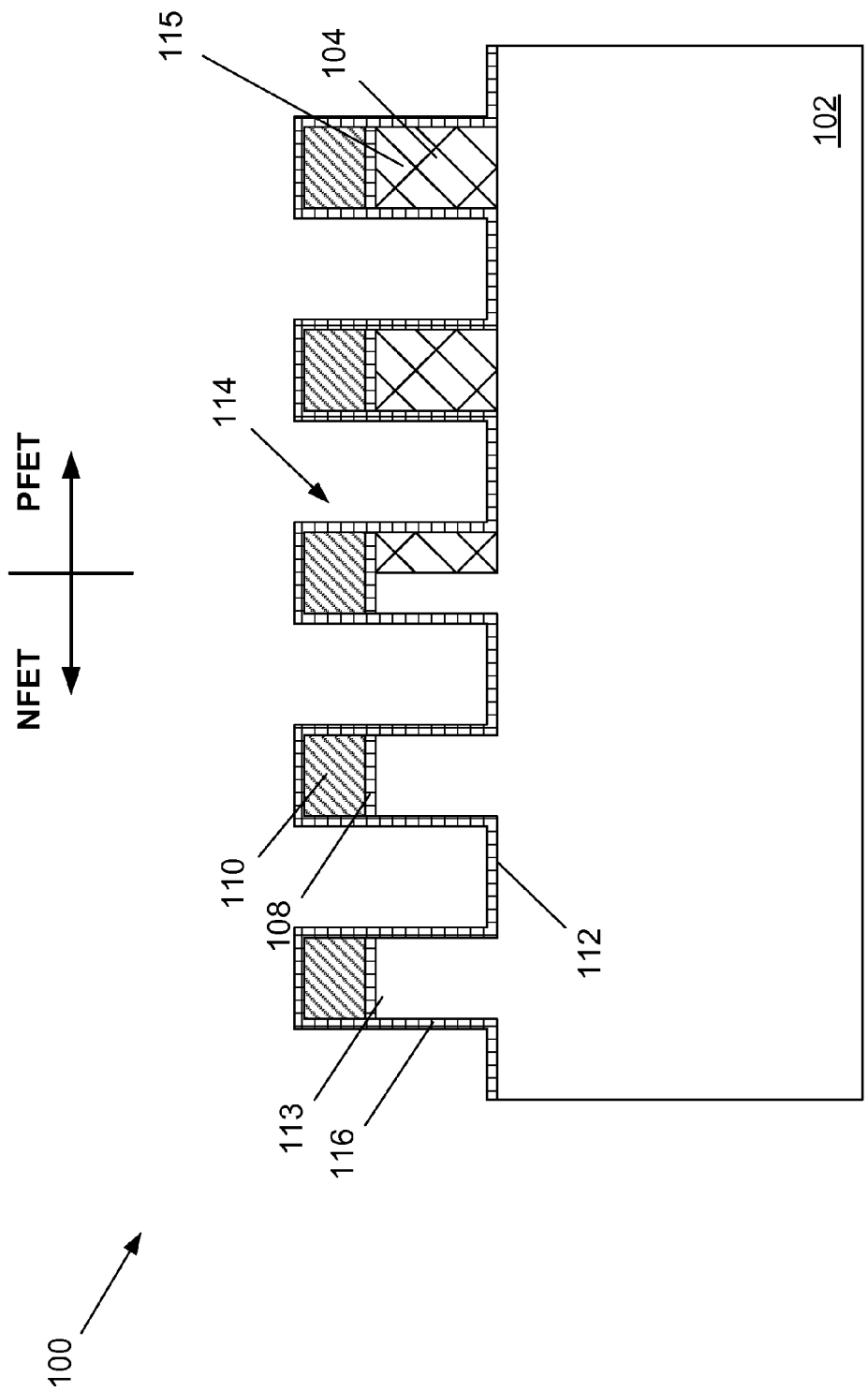
Figure 2D:
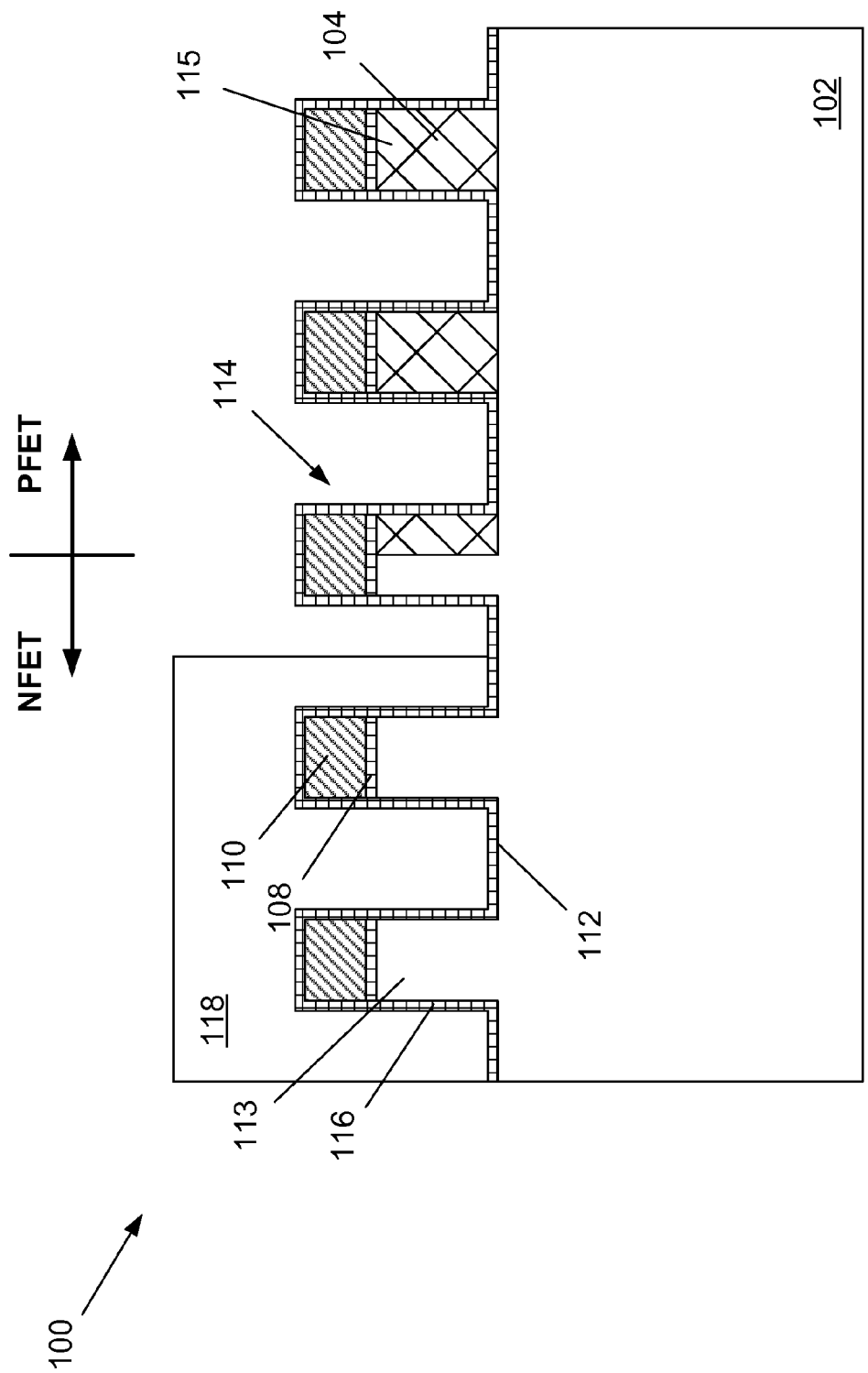
Figure 2E:
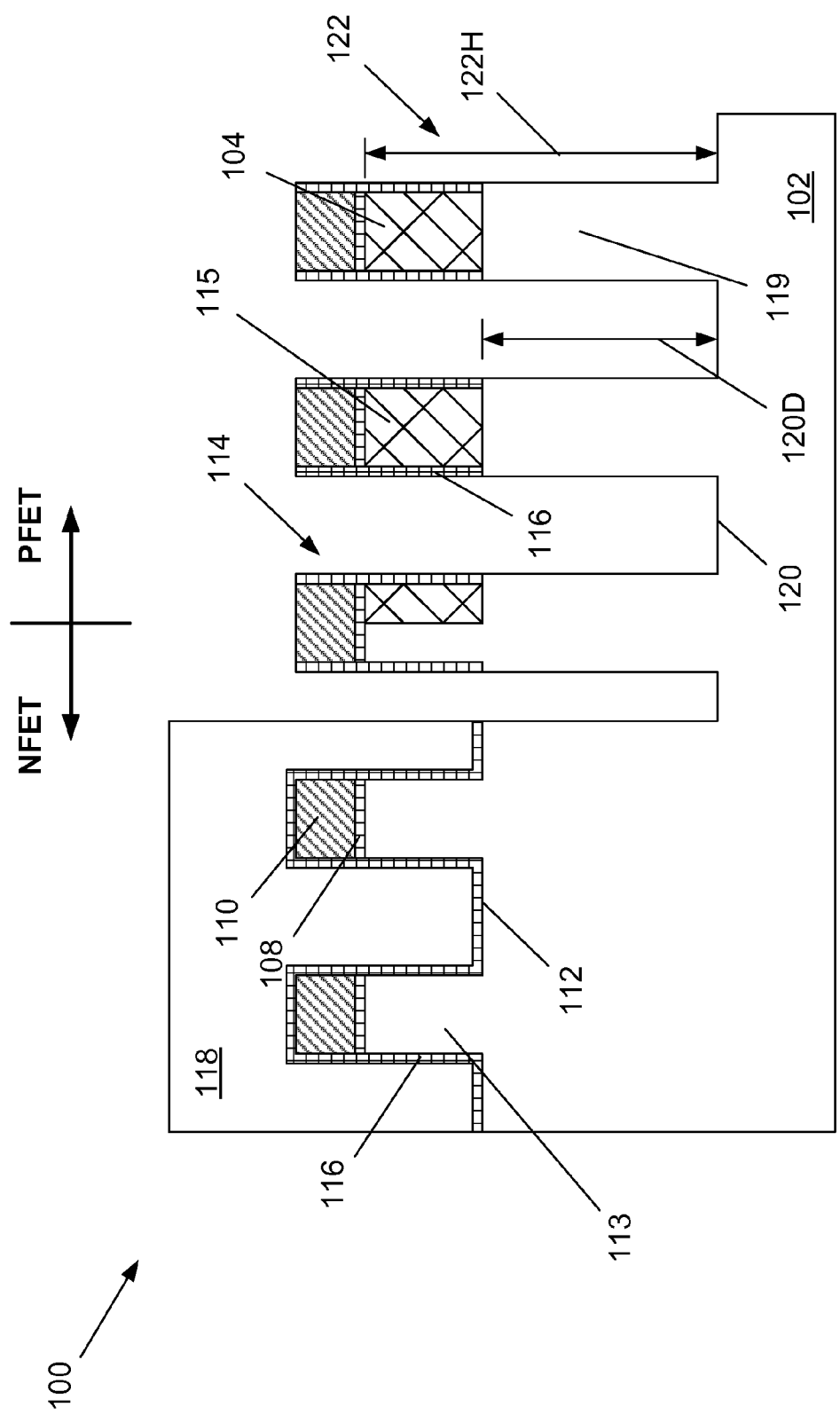
Figure 2F:
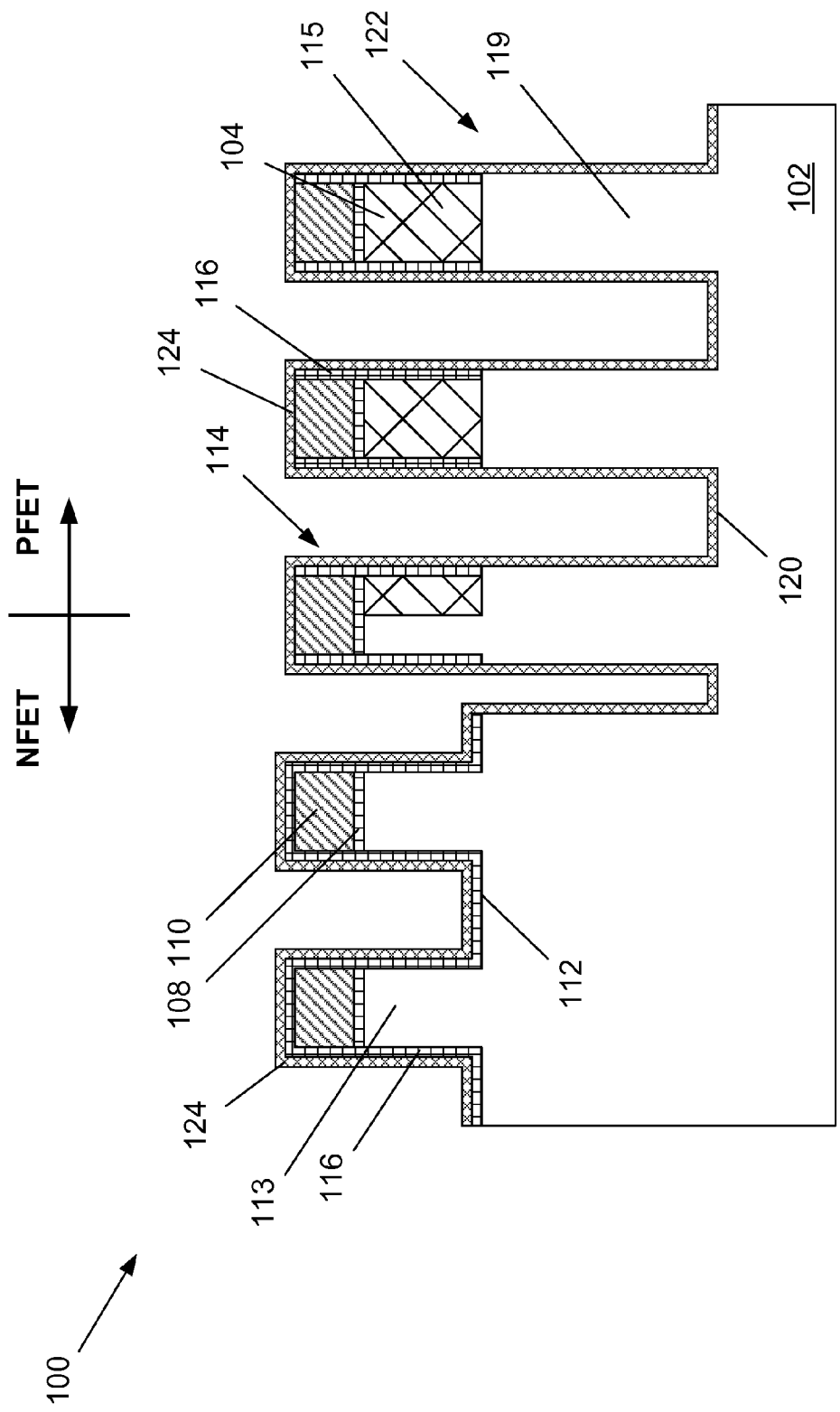
Figure 2G:
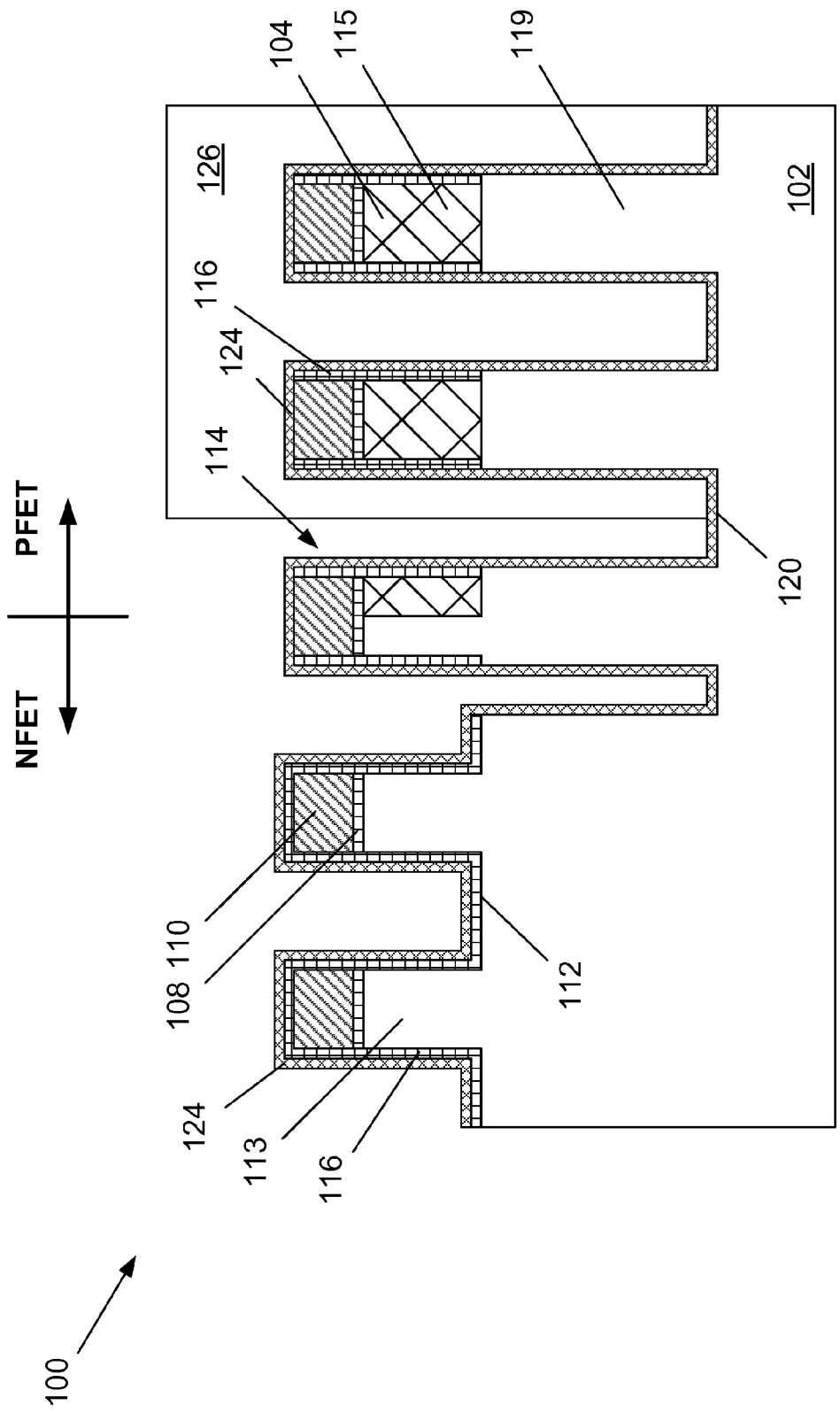
Figure 2H:
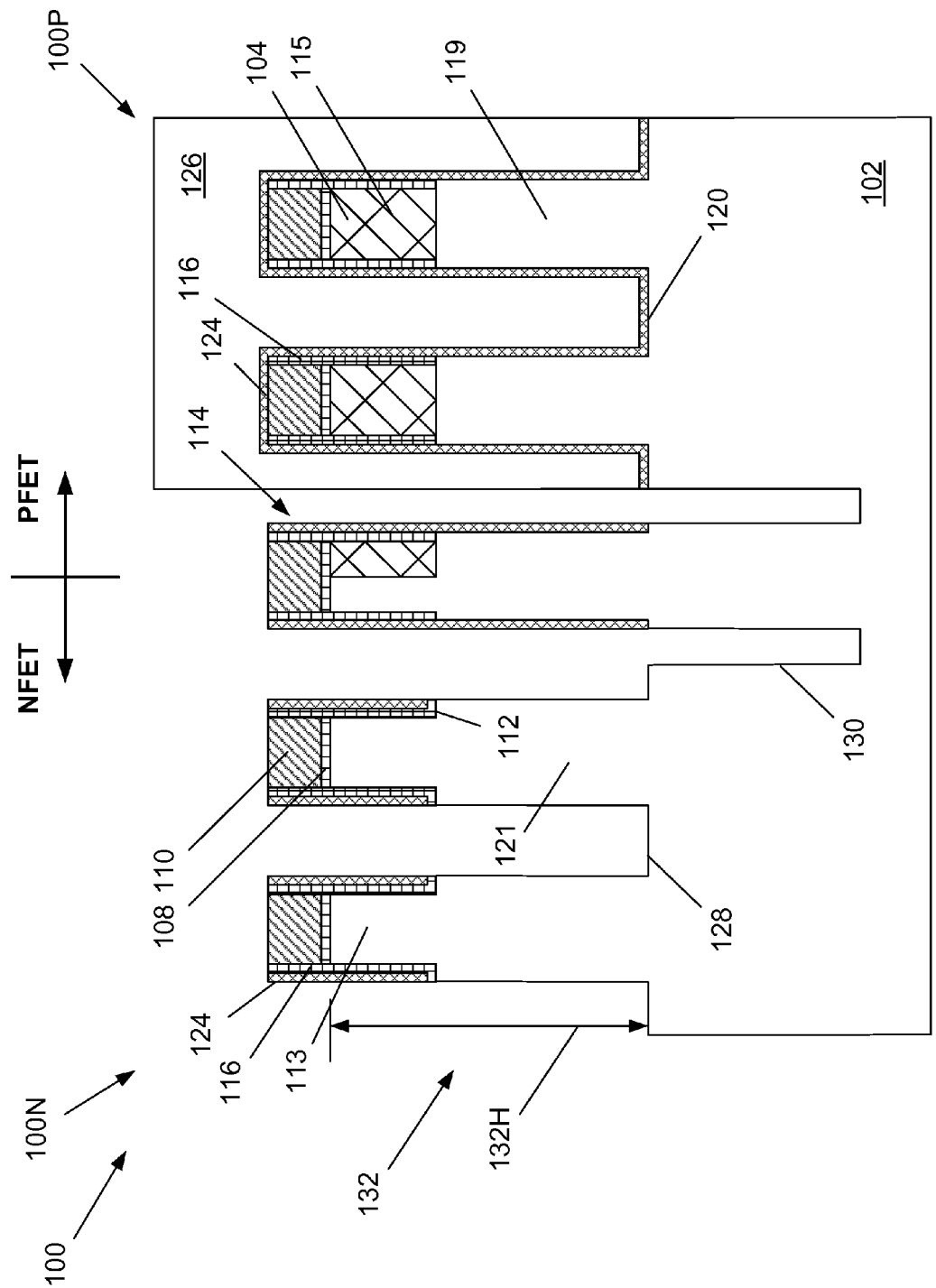
Figure 2I:
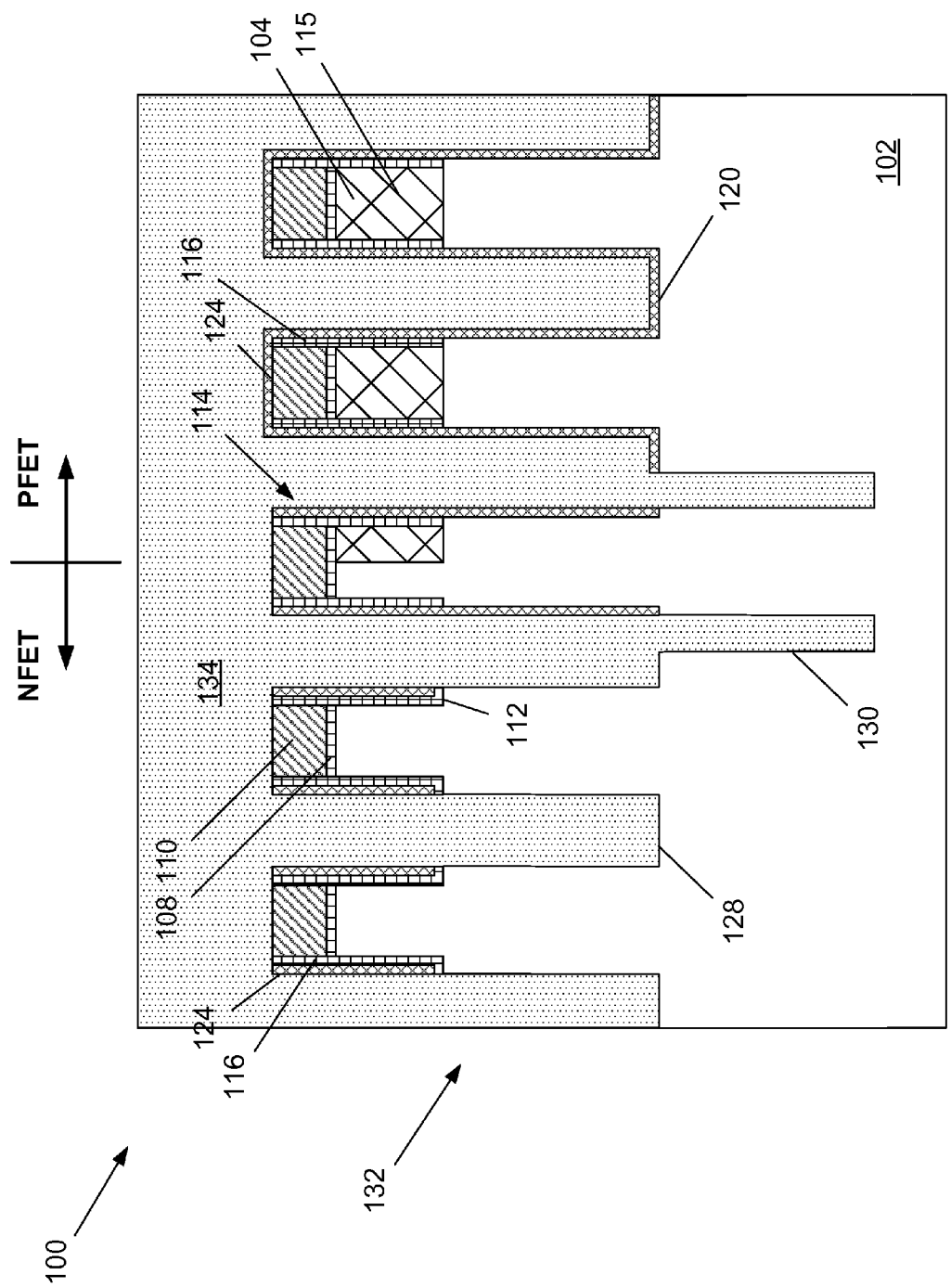
Figure 2J:
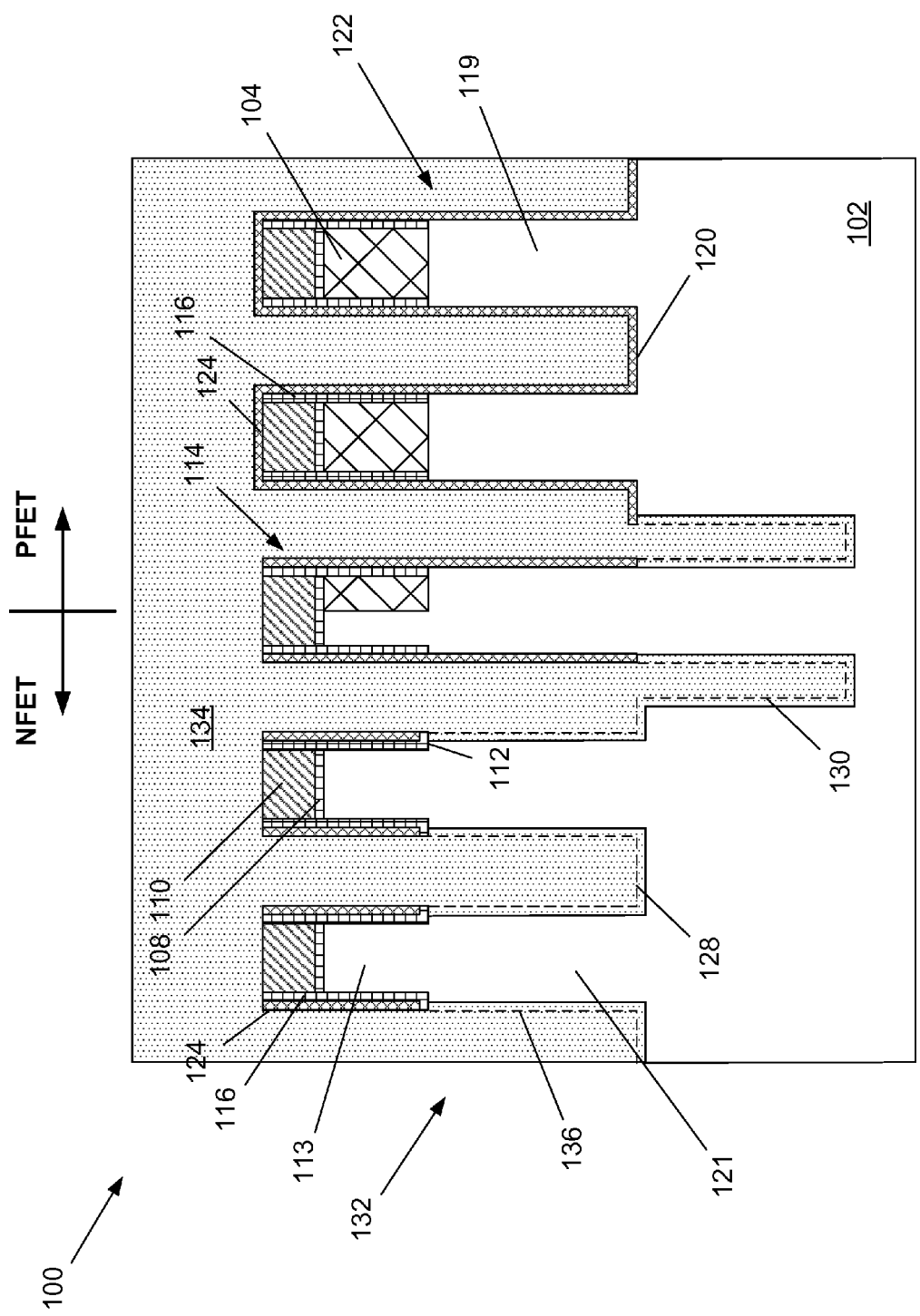
Figure 2K:
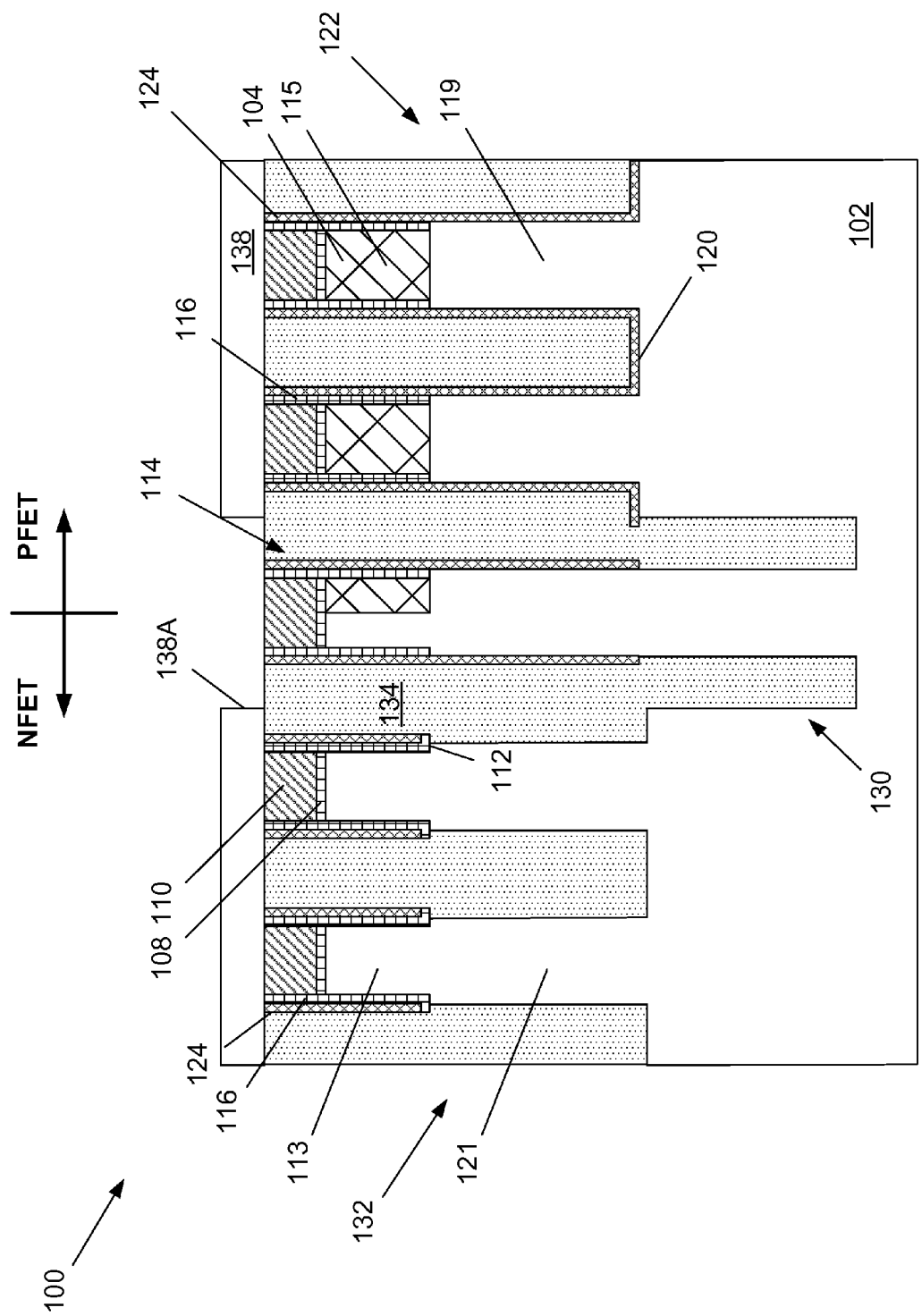
Figure 2L:
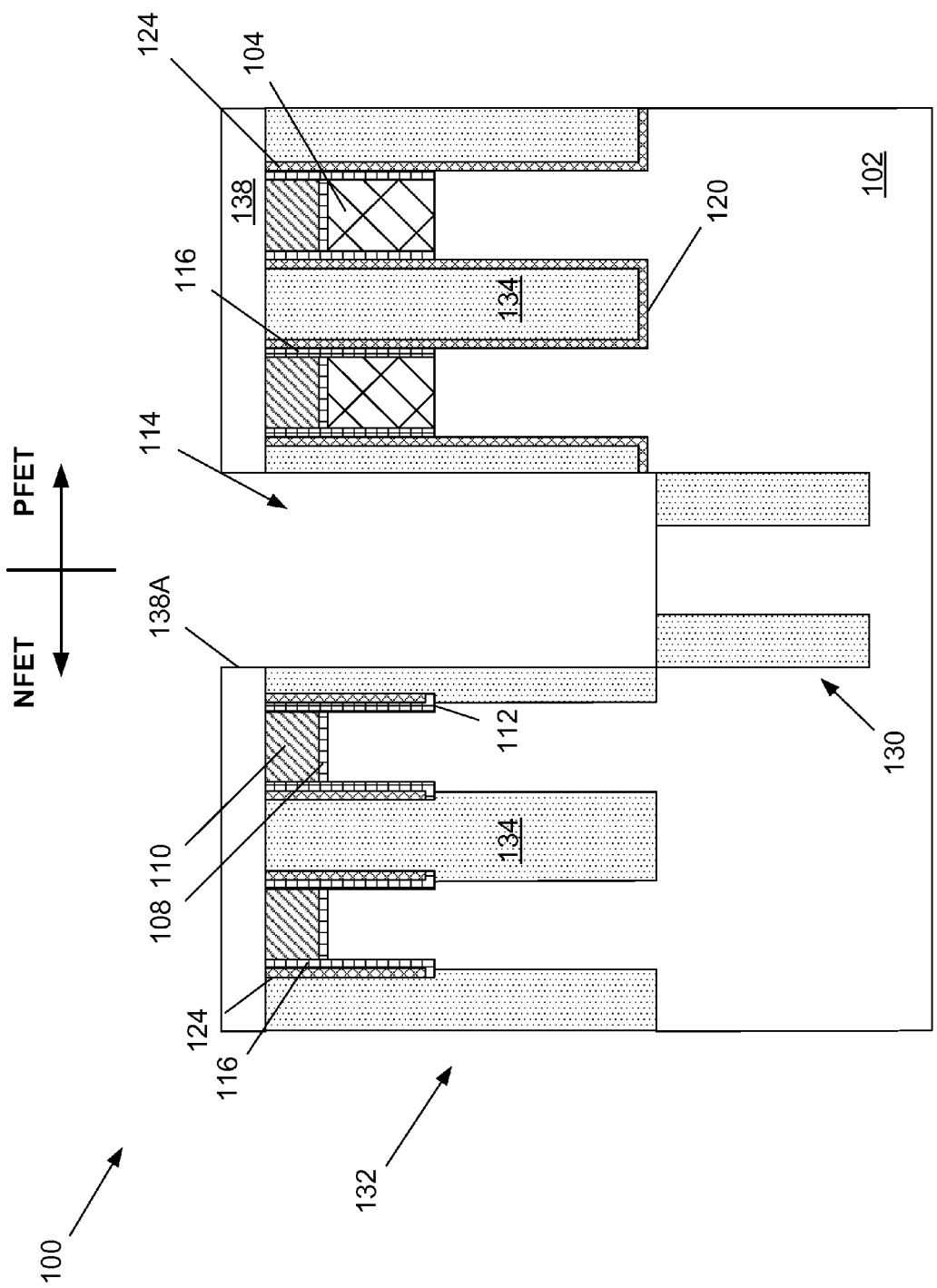
Figure 2M:
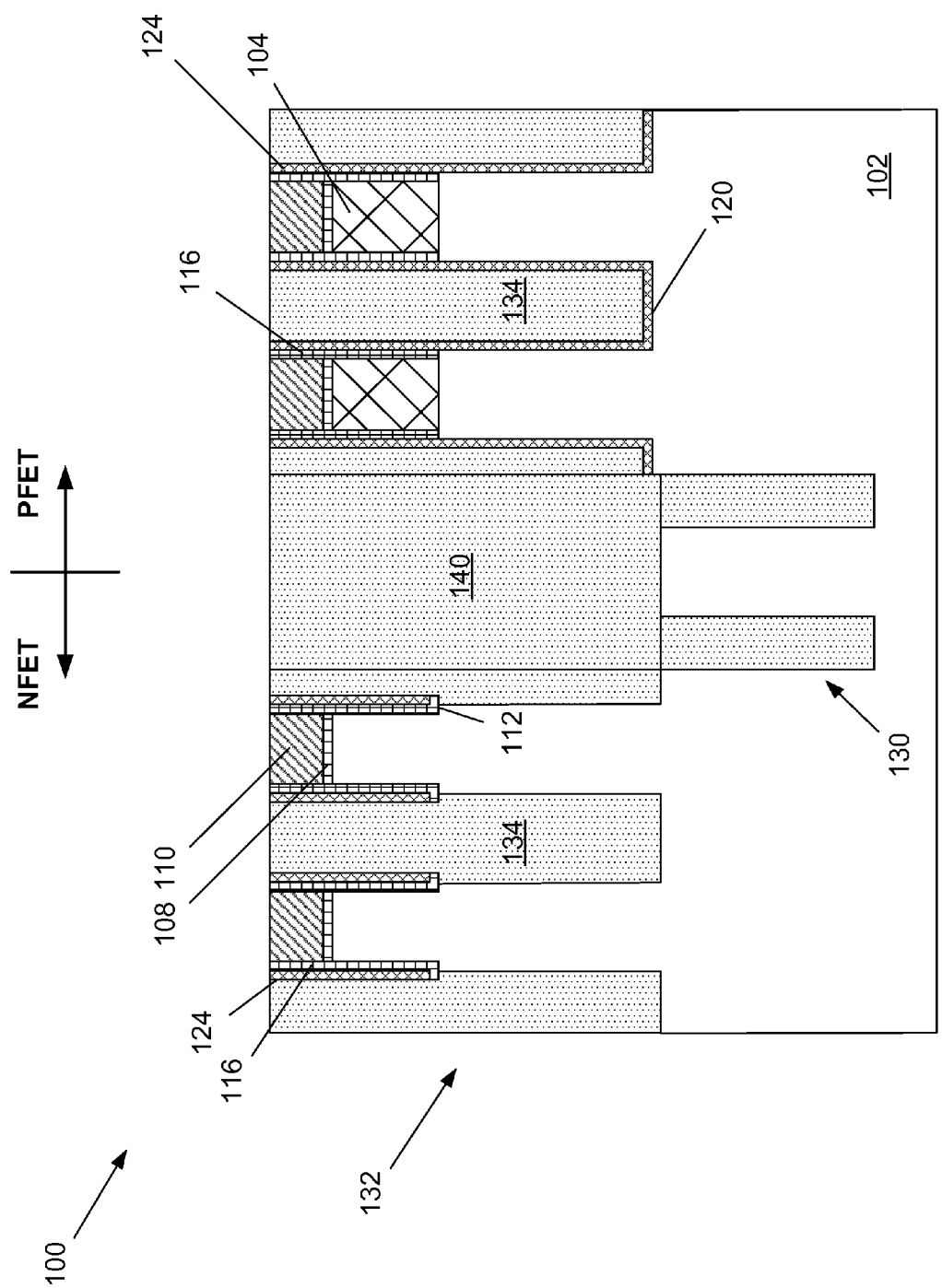
Figure 2N:
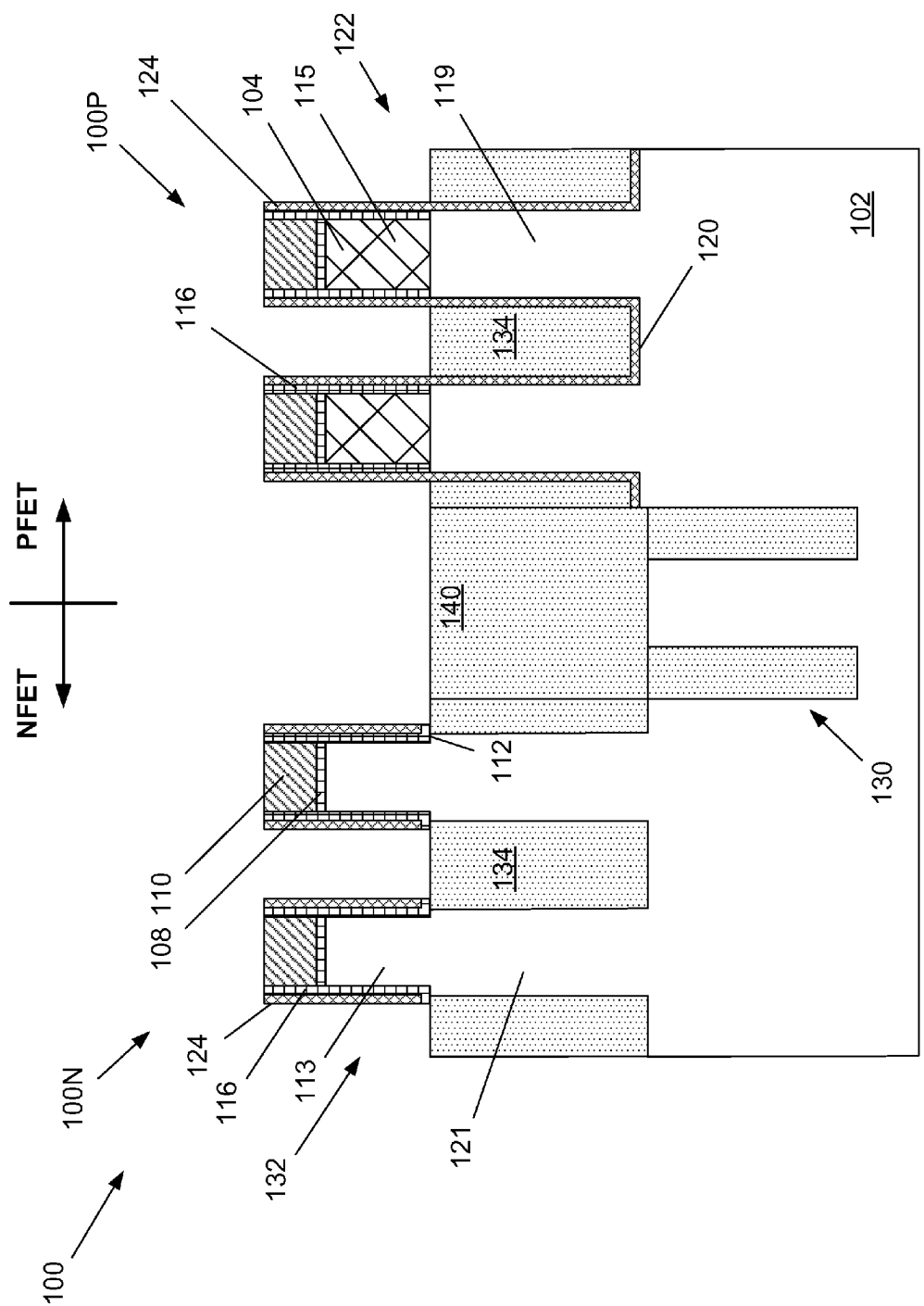
Figure 2O:
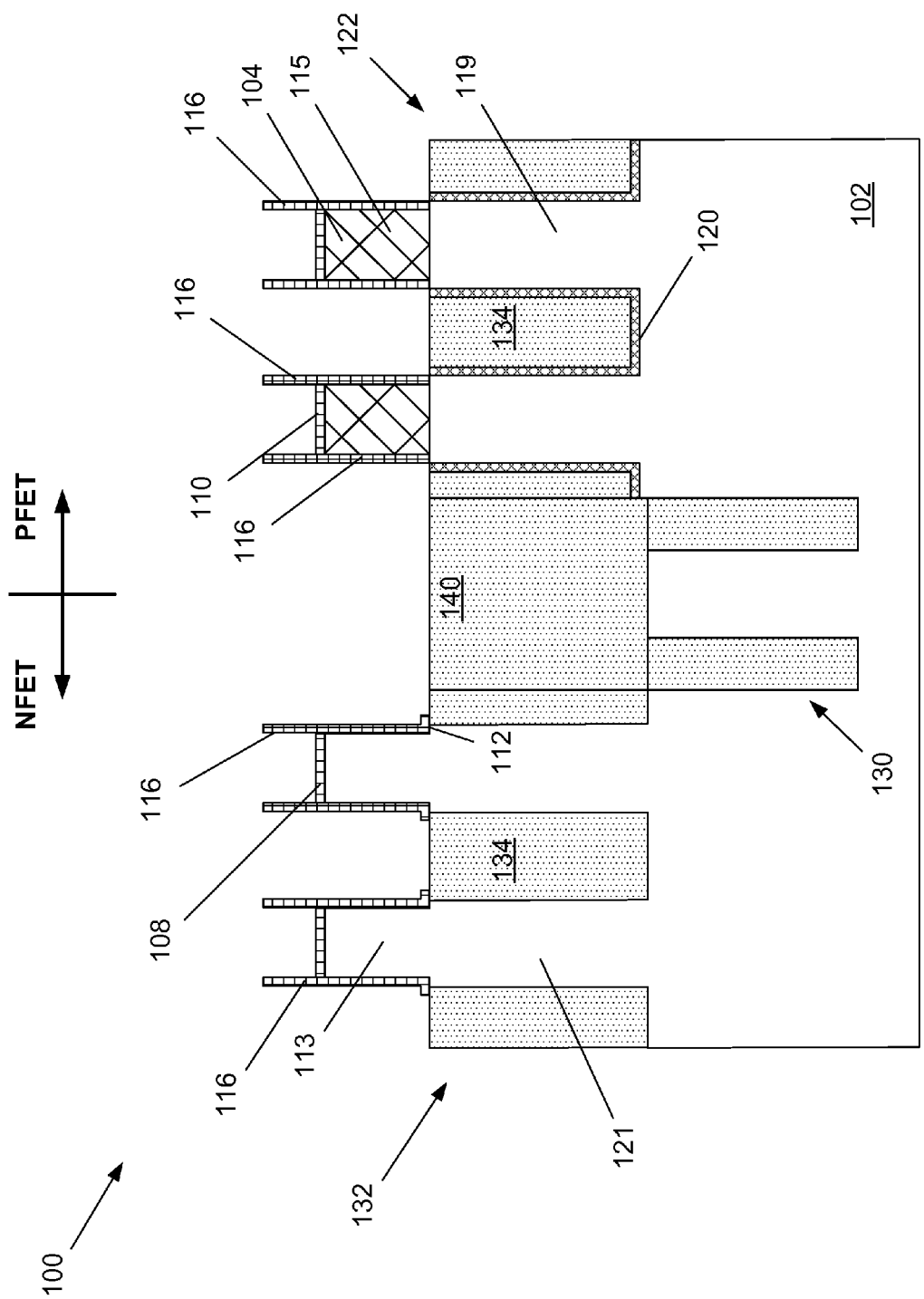
Figure 2P:
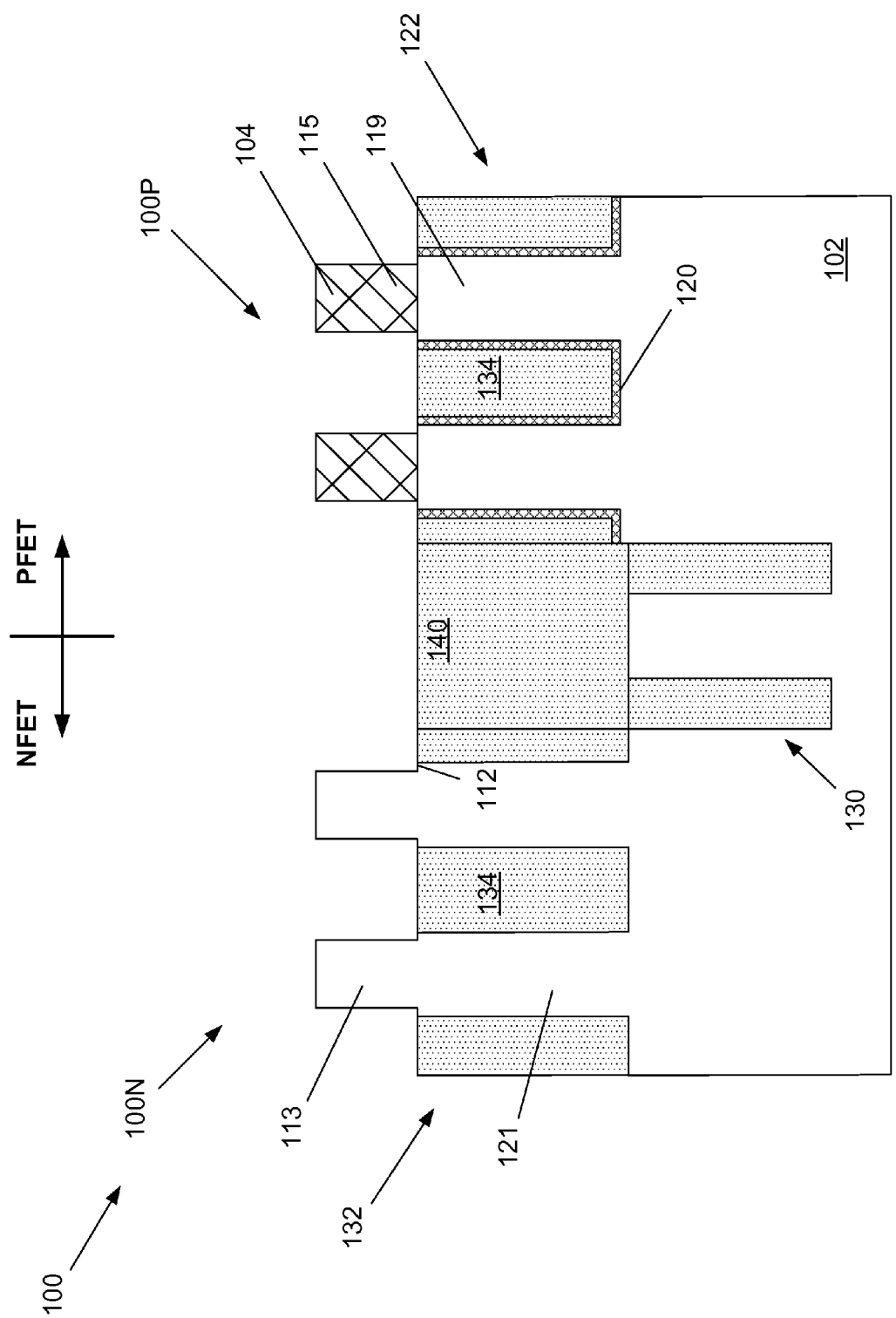
Figure 2Q:
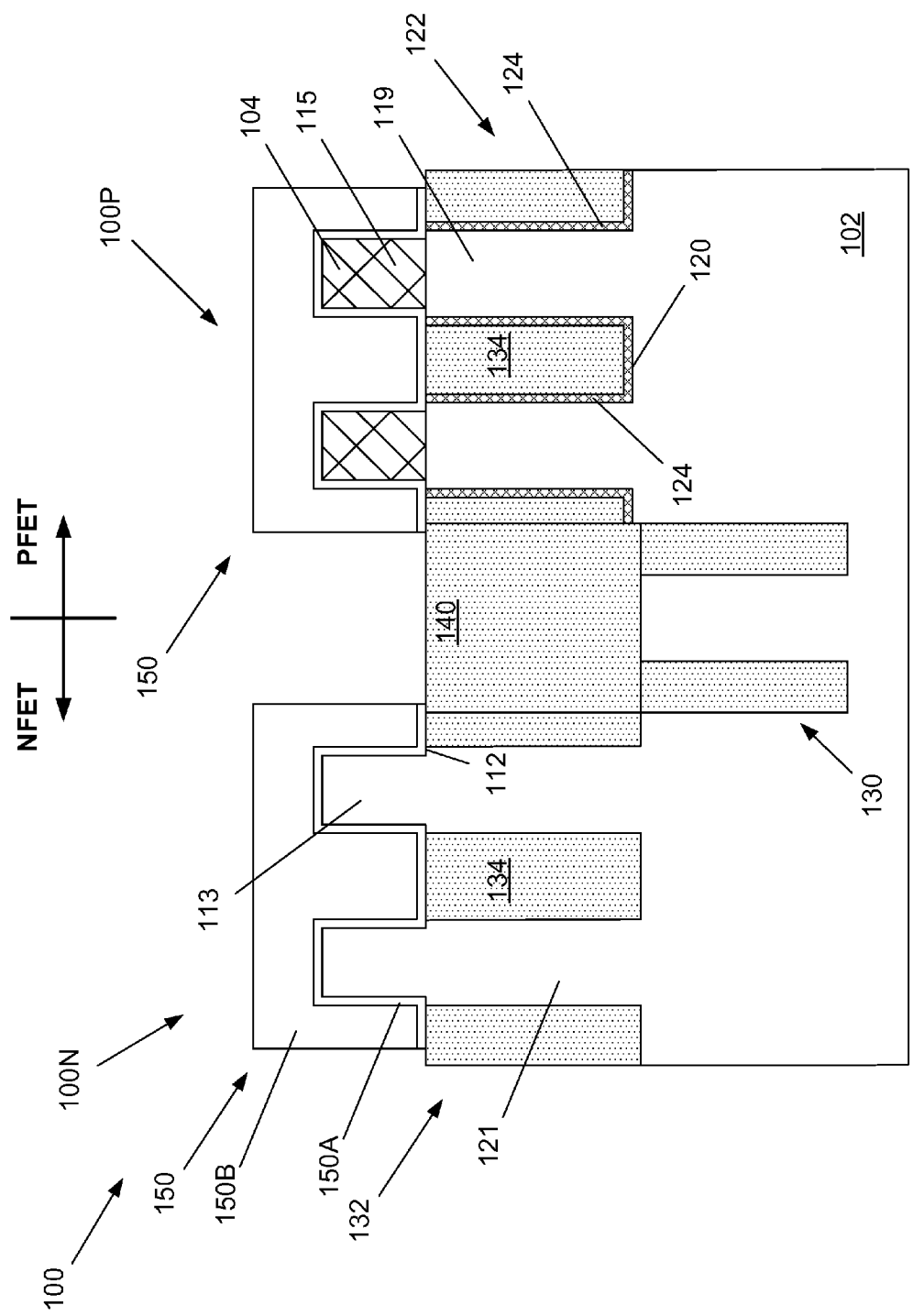

FIGS. 2A-2Q depict various methods of using a dual liner approach for forming CMOS integrated circuit products that employ NFET and PFET FinFET devices, and the resulting device structures. FIG. 2A depicts the product 100 after several process operations were performed and the regions where the NFET device 100N and the PFET device 100P will be formed. First, an alternative semiconductor material layer 104 was formed in a region of the substrate 102 where a PFET device 100P will be formed. The alternative semiconductor material layer 104 may be formed by performing an epitaxial deposition process. In general, the alternative semiconductor material layer 104 is a semiconductor material that is different than the semiconductor material of the substrate 102. For example, in the illustrative case where the substrate is a silicon substrate, the alternative semiconductor material layer 104 may be a germanium-containing material $Si_xGe_{(1-x)}$ (where x ranges from zero to about 0.9) such as $Si_{0.75}Ge_{0.25}$ or substantially pure germanium. The alternative semiconductor material layer 104 may also be made of one or more III-V semiconductor materials (or combinations thereof). The thickness of the layer of alternative semiconductor material 104 may vary depending upon the particular application, e.g., about 30-40 nm in one illustrative embodiment. Thus, the alternative semiconductor material layer 104 referenced herein should not be considered to be limited to any particular semiconductor material. In one illustrative embodiment, the alternative semiconductor material layer 104 may be formed in the substrate 102 by initially forming a trench 103 in the substrate 102, performing an epi deposition process to form the alternative semiconductor material layer 104 in the trench 103 and thereafter performing a chemical mechanical planarization (CMP) process.

Also depicted in FIG. 2A is a patterned etch mask layer 106 that was formed above the substrate 102 and the alternative semiconductor material layer 104. The patterned etch mask 106 will be used in performing various etching processes to define the fins in the NFET and PFET devices. The patterned mask layer 106 is intended to be representative in nature as it could be comprised of multiple layers of material, such as, for example, a pad oxide layer 108 and a pad silicon nitride layer 110 that is formed on the pad oxide layer. The patterned mask layer 106 may be formed by depositing the layer(s) of the mask layer 106 and thereafter performing one or more etching processes through a patterned layer of photoresist material (not shown). Thus, the particular form and composition of the patterned mask layer 106 and the manner in which it is made should not be considered a limitation of the presently disclosed inventions.

FIG. 2B depicts the product 100 after one or more first fin-formation etching processes, such as dry anisotropic etching processes, were performed through the patterned mask layer 106, the substrate 102 and the alternative semiconductor material layer 104 so as to form a plurality of initial, relatively shallow fin-formation trenches 112. This operation results in the definition of upper portions 113 of the fins for the NFET device 100N and upper portions 115 of the fins for the PFET device 100P. At this point in the process flow, the exposed portion of the upper portion of the fin 114 at the intersection of the NFET and PFET regions is comprised of both the material of the substrate 102 and the alternative semiconductor material layer 104. The upper portions 113 of the fins for the NFET device 100N are comprised of the material of the substrate 102. The upper portions 115 of the fins for the PFET device 100P are comprised of the alternative semiconductor material layer 104. At this point in the process, the height 117 of the upper portions 113, 115 of the fins (or depth of the initial fin-formation trenches 112) may vary, e.g., 30-40 nm. As described more fully below, at a later point in the process, the initial fin 114 will be removed.

The overall size, shape and configuration of the fin-formation trenches 112 and the upper portions 113, 115 of the fins may vary depending on the particular application. The depth and width of the initial fin-formation trenches 112 may vary depending upon the particular application. In one illustrative embodiment, based on current day technology, the lateral width of the initial fin-formation trenches 112 may range from about 20-30 nm. In the illustrative example depicted herein, the initial, shallow fin-formation trenches 112 and the upper portions 113, 115 of the fins are all depicted as having a uniform size and shape. However, such uniformity in the size and shape of the initial, shallow fin-formation trenches 112 and the upper portions 113, 115 of the fins is not required to practice at least some aspects of the inventions disclosed herein. In the example depicted herein, the initial, shallow fin-formation trenches 112 are depicted as having been formed by performing an anisotropic etching process that results in the initial, shallow fin-formation trenches 112 having a schematically depicted, generally rectangular configuration. In an actual real-world device, the sidewalls of the initial, shallow fin-formation trenches 112 may be somewhat inwardly tapered, although that configuration is not depicted in the drawings. Thus, the size and configuration of the initial, shallow fin-formation trenches 112, and the manner in which they are made, should not be considered a limitation of the present invention. For ease of disclosure, only the substantially rectangular initial, shallow fin-formation trenches 112 and the substantially rectangular shaped upper portions 113, 115 of the fins will be depicted in subsequent drawings.

FIG. 2C depicts the product 100 after a conformal deposition process (e.g., ALD, CVD, etc.) was performed to form a conformal etch stop liner layer 116 on and around the upper portions 113, 115 of the fins and in the bottom of the initial fin-formation trenches 112 in both the NFET and PFET regions of the CMOS product 100. The material of the etch stop liner layer 116 and its thickness may vary depending upon the particular application. In one illustrative embodiment, the etch stop liner layer 116 may be a layer of, for example, silicon dioxide, and it may have a thickness of about 2-5 nm.

FIG. 2D depicts the product 100 after a patterned PFET device etch mask 118 was formed on the product 100. The patterned PFET device etch mask 118 covers the NFET region and leaves the PFET region exposed for further processing. The patterned PFET device etch mask 118 may be a patterned hard mask layer, OPL, or it may be a patterned layer of photoresist material, etc.

FIG. 2E depicts the product 100 after one or more second fin-formation anisotropic etching processes were performed through the patterned PFET device mask layer 118. These etching processes remove horizontally positioned portions of the etch stop liner layer 116 and define relatively deep fin formation trenches 120 in the PFET region of the substrate 102. This operation results in the formation of a lower portion 119 of the fins for the PFET device 100P. Collectively the upper portion 115 and the lower portion 119 define the overall fins 122 for the PFET device 100P. The fins 122 are comprised of a portion of the substrate material 102 and a portion of the alternative semiconductor material layer 104. The depth 120D of the deep trenches 120 may vary depending upon the particular application, e.g., 60-70 nm. In one example, the fins 122 for the PFET device 100P may have an overall height 122H of about 100 nm. Note that, after the formation of the fins 122, portions of the etch stop liner layer 116 remain to protect the alternative semiconductor material layer 104 portion of the fins 122.

As before, the overall size, shape and configuration of the fin-formation trenches 120 and the fins 122 may vary depending on the particular application. In the illustrative example depicted herein, the fin-formation trenches 120 and the fins 122 are all depicted as having a uniform size and shape. However, such uniformity in the size and shape of the fin-formation trenches 120 and the fins 122 is not required to practice at least some aspects of the inventions disclosed herein. In the example depicted herein, the fin-formation trenches 120 are depicted as having been formed by performing an anisotropic etching process that results in the fin-formation trenches 120 having a schematically depicted, generally rectangular configuration. In an actual real-world device, the sidewalls of the fin-formation trenches 120 may be somewhat inwardly tapered, although that configuration is not depicted in the drawings. Thus, the size and configuration of the fin-formation trenches 120, and the manner in which they are made, should not be considered a limitation of the present invention. For ease of disclosure, only the substantially rectangular fin-formation trenches 120 and the substantially rectangular shaped fins 122 will be depicted in subsequent drawings.

FIG. 2F depicts the product 100 after several process operations were performed. First, the patterned PFET device etch mask layer 118 was removed. Thereafter, a conformal deposition process (e.g., ALD, CVD, etc.) was performed to form a conformal protection liner layer 124 in both the NFET and PFET regions of the CMOS product 100. More specifically, the conformal protection liner layer 124 was formed around the upper portions 113 of the fins in the NFET region and around the entirety of the fins 122 in the PFET region. The material of the protection liner layer 124 and its thickness may vary depending upon the particular application. In one illustrative embodiment, the protection liner layer 124 may be a layer of, for example, silicon nitride, and it may have a thickness of about 2-5 nm.

FIG. 2G depicts the product 100 after a patterned NFET device etch mask 126 was formed on the product 100. The patterned NFET device etch mask 126 covers the PFET region and leaves the NFET region exposed for further processing. The patterned NFET device etch mask 126 may be a patterned hard mask layer, OPL, or it may be a patterned layer of photoresist material, etc.

FIG. 2H depicts the product 100 after one or more third fin-formation anisotropic etching processes were performed through the patterned NFET device mask layer 126. These etching processes remove horizontally positioned portions of the liner layer 124, the liner layer 116 and define deep fin formation trenches 128 in the NFET region of the substrate 102. These process operations also result in the formation of a lower portion 121 of the final overall fins 132 for the NFET device 100N as well as the formation of extra deep trenches 130 in the substrate 102 adjacent the to-be-removed fin 114. The depth of the deep trenches 128 may vary depending upon the particular application, e.g., 60-70 nm. The fins 132 for the NFET device 100N are comprised of the substrate material, e.g., the alternative material 104 is not part of the fins 132 for the NFET device 100N. In one example, the fins 132 for the NFET device 100N may have an overall height 132H of about 100 nm. In one embodiment, the extra deep trenches 130 may extend into the substrate 102 about 40-60 nm beyond the depth of the trenches 128. Note that, after the formation of the fins 132, portions of both the liner layer 116 and the liner layer 124 remain adjacent an upper portion 113 of the fins 132.

As before, the overall size, shape and configuration of the fin-formation trenches 128 and the fins 132 may vary depending on the particular application. In the illustrative example depicted herein, the fin-formation trenches 128 and the fins 132 are all depicted as having a uniform size and shape. However, such uniformity in the size and shape of the fin-formation trenches 128 and the fins 132 is not required to practice at least some aspects of the inventions disclosed herein. In the example depicted herein, the fin-formation trenches 128 are depicted as having been formed by performing an anisotropic etching process that results in the fin-formation trenches 128 having a schematically depicted, generally rectangular configuration. In an actual real-world device, the sidewalls of the fin-formation trenches 128 may be somewhat inwardly tapered, although that configuration is not depicted in the drawings. Thus, the size and configuration of the fin-formation trenches 128, and the manner in which they are made, should not be considered a limitation of the present invention. For ease of disclosure, only the substantially rectangular fin-formation trenches 128 and the substantially rectangular shaped fins 132 will be depicted in subsequent drawings.

FIG. 2I depicts the product 100 after several process operations were performed. First, the patterned NFET device etch mask layer 126 was removed. Thereafter, a layer of insulating material 134, e.g., silicon dioxide, was formed so as to over-fill the trenches.

FIG. 2J depicts the product 100 after a densification steam anneal process (e.g., at about 500-600° C.) was performed to densify the insulating material 134. Given the small size of the trenches formed in forming the fins 122 and 132, the insulation material 134, as initially deposited, must have good gap-fill properties. Typically, this means that the density of the insulation material 134 is required to be relatively low so that it can readily fill the trenches. Thus, after the insulating material 134 is formed, it is desirable to increase its density such that it can withstand the additional process operations to which it will be later exposed without experiencing a loss of an unacceptable amount of the insulation material 134. Note that, for the PFET device 100P, the presence of the SiN protection liner layer 124 around the upper portion 115 and lower portion 119 of the fins 122 prevents the oxidation of the underlying fin materials during the steam anneal densification process. Similarly, the presence of the SiN protection liner layer 124 around the upper portion 113 of the fins 132 for the NFET device 100N also protect the underlying portions of those fins from oxidation during the steam anneal densification process. However, the lower portions 121 of the fins 132 that are not covered by the SiN protection liner layer 124 do experience some oxidation during the steam anneal densification process, as reflected by the dashed line 136 which shows pre-anneal location of the relevant surfaces.

FIG. 2K depicts the product 100 after several process operations were performed. First, one or more chemical mechanical polishing (CMP) processes were performed to planarize the surface of the layer of insulating material using the layer 110 of the patterned mask layer 106 as a polish-stop layer. Thereafter, a patterned etch mask 138, i.e., a "fin cut" mask, was formed on the product 100. The patterned etch mask 138 covers both the PFET region and the NFET region but it has an opening 138A that exposes the to-be-removed fin 114 and a portion of the insulating material 134. The extent to which the opening 138A extends into and out of the drawing page may vary depending upon the particular application, i.e., the amount of the axial length of the fin 114 that will be removed may vary depending upon the particular application. The patterned etch mask 138 may be a patterned hard mask layer, OPL, or it may be a patterned layer of photoresist material, etc. Of course, the number of fins 114 to be removed may vary depending upon the particular application.

FIG. 2L depicts the product 100 after one or more etching processes were performed through the patterned mask layer 138 to remove the fin 114 (including the materials 108, 110, 124, 116 and 104) and the exposed portion of the insulating material 134. In the depicted example, the entirety of the vertical height of the fin 114 is removed, although that may not be the case in all applications.

FIG. 2M depicts the product 100 after several process operations were performed. First, the patterned etch mask layer 138 was removed. Thereafter, a layer of insulating material 140, e.g., silicon dioxide, was formed so as to over-fill the trenches. Then, one or more chemical mechanical polishing (CMP) processes were performed to planarize the surface of the layer of insulating material 140 using the layer 110 of the patterned mask layer 106 as a polish-stop layer. The layer of insulating material 140 may be made of the same material as that of the layer 134.

FIG. 2N depicts the product 100 after a recess etching process (i.e., a "fin-reveal" etching process) was performed on the insulating materials 134/140 to reduce their thickness and thereby exposes the final fin height of the fins 132 (for the NFET device 100N) and the fins 122 (for the PFET device 100P). In the depicted example, the recess etching process is controlled such that substantially all of the alternative semiconductor material 104 of the fins 122 for the PFET device 100P is positioned above the recessed surface of the insulating materials 134/140. The final fin height may vary depending upon the particular application and, in one illustrative embodiment, may range from about 30-40 nm.

FIG. 2O depicts the product 100 after an etching process was performed to remove the exposed silicon nitride materials, e.g., the conformal protection liner layer 124 and the layer 110 of the patterned etch mask 106. Note that, during this etching process, silicon dioxide material, e.g., the etch stop liner layer 116 and the layer 110 of the patterned etch mask 106, protect the upper portions 113, 115 of the fins 132 and 122, respectively, and particularly the alternative semiconductor material 104 of the fins 122 for the PFET device 100P.

Next, as shown in FIG. 2P, a brief etch or cleaning process was performed to remove the remaining portions of the conformal etch stop liner layer 116 and the layer 110 from the upper portions 113, 115 of the fins 132 and 122, respectively.

At this point in the process flow, traditional manufacturing operations may be performed to complete the product 100. For example, FIG. 2Q depicts the product 100 after illustrative and schematically depicted gate structures 150 were formed for the NFET and PFET devices. In one illustrative embodiment, the schematically depicted gate structures 150 include an illustrative gate insulation layer 150A and an illustrative gate electrode 150B. The gate insulation layer 150A may be comprised of a variety of different materials, such as, for example, silicon dioxide, a so-called high-k (k greater than 10) insulation material (where k is the relative dielectric constant), etc. Similarly, the gate electrode 150B may also be of a material such as polysilicon or amorphous silicon, or it may be comprised of one or more metal layers that act as the gate electrode 150B. As will be recognized by those skilled in the art after a complete reading of the present application, the gate structure 150 of the FinFET devices depicted in the drawings, i.e., the gate insulation layer 150A and the gate electrode 150B, is intended to be representative in nature. That is, the gate structure 150 may be comprised of a variety of different materials and it may have a variety of configurations, and the gate structure 150 may be sacrificial gate structures or final gate structures, i.e., the gate structures of the FinFET devices disclosed herein may be made using either the so-called "gate-first" or "replacement gate" techniques. Of course, the gate structures 150 for the NFET and PFET devices may be made of different materials.

Using the novel methods disclosed herein may provide several benefits relative to prior art processing techniques. For example, as noted above, by use of the dual liner layer approach, the alternative semiconductor material portion 104 of the fins 122 for the PFET device may be protected during some etching processes and may not suffer the unwanted consumption described in the background section of this application, and will not be exposed to oxidation during the densification anneal process described above. Additionally, by using the approach described herein, the silicon nitride protection liner layer 124 is positioned on and in contact with the lower portion 119 of the fins 122 in the final PFET device 100P (see FIG. 2Q). That is, since this silicon nitride protection layer 124 remains in position on the lower portion 119 (i.e., the body portion) of the fins 122 for the PFET device 100P, undesirable "punch-through" currents may be reduced given the positive nature of the silicon nitride material and the operational characteristics of the PFET device 100P. More specifically, for a PFET device, the lower portion of the fin body is typically doped with an N-type dopant such as arsenic. The doping concentration should be higher in the fin body compared to the doping concentration of N-type dopants near or in the channel region of the fin. The N-type doping in the lower portion of the fin body is provided to prevent punchthrough leakage (leakage from source and drain). However, performing an additional N-type implantation process (with a higher implant dose) to add additional N-type dopant material to the lower portion of the fin can damage the channel region of the device due to implantation-related damage such as channel lattice dislocation. If a positive charge layer of material (e.g., silicon nitride) is positioned so as to surround the lower portion of the fin body, the positive charge material will attract more electrons into the lower portion of the fin body, which depletes holes. The presence of this positive charge material layer has the same effect as that of an implantation of an N-type dopant (e.g., arsenic)—to locally increase the electron concentration in a particular region. Thus, by putting a silicon nitride liner having positive charge adjacent the lower portion of the fin body, effective punch-through stopping may be created without the detrimental effects of performing an additional higher dose N-type implant process.

On the other hand, putting a positive charge silicon nitride liner on the lower portions of an NFET fin body would be detrimental for punch\-through control on the NFET device. In an NFET device, electrons act as current carriers. A P-type implant, such as boron, is typically implanted into the lower portion of the fin body to prevent the punch-through. Putting a positive charge silicon nitride liner will attract more electrons into the lower portion of the fin body which makes it easier for the punch-through to happen. Thus, the silicon nitride liner layer is removed from the lower portion of the fin for the NFET device using the method disclosed herein. Additionally, the formation of the extra deep trenches 130 is a characteristic signature of the performance of the dual liner methodology as described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method, comprising:
forming a patterned etch mask above a semiconductor substrate;
performing at least one first trench etching process through said patterned etch mask to define an upper portion of a first fin for an NFET device and an upper portion of a second fin for a PFET device;
performing a first conformal deposition process to form a conformal etch stop layer around said upper portion of both said first and second fins;
forming a PFET device etch mask that covers said NFET device and exposes said PFET device;
with said PFET device etch mask in position, performing at least one second trench etching process through said patterned etch mask to define a lower portion of said second fin and to remove portions of said conformal etch stop layer;
performing a second conformal deposition process to form a conformal protection layer on remaining portions of said conformal etch stop layer adjacent said upper portion of said first and second fins and on sidewalls of said lower portion of said second fin; and
performing at least one third trench etching process through said patterned etch mask to remove first portions of said conformal protection layer while leaving second portions of said conformal protection layer adjacent said upper portion of said first and second fins and on said sidewalls of said second fin.

2. The method of claim 1, wherein said conformal etch stop layer is made of silicon dioxide and said conformal protection layer is made of silicon nitride.

3. The method of claim 1, wherein said upper portion of said second fin for said PFET device is comprised of a semiconductor material that is different than the semiconductor material of said substrate.

4. The method of claim 3, wherein said semiconductor substrate material is silicon and said upper portion of said second fin comprises a germanium-containing semiconductor material $Si_xGe_{(1-x)}$ (where x ranges from zero to about 0.9) or at least one III-V semiconductor material.

5. The method of claim 1, further comprising:
forming a layer of insulating material so as to overfill trenches formed adjacent said first and second fins; and
with said layer of insulating material in position, performing a steam densification anneal process with said conformal protection layer in position around said upper portion of said second fin and on said lower portion of said second fin.

6. The method of claim 5, further comprising:
performing a recess etching process on said layer of insulating material such that it has a recessed upper surface that is at a level such that at least a portion of said upper portions of said first and second fins is positioned above said level of said recessed upper surface of said layer of insulating material;

performing an etching process to remove portions of said conformal protection layer positioned above said recessed upper surface of said layer of insulating material while using said conformal etch stop layer as an etch stop during said etching process; and after removing said conformal protection layer, performing an etching process to remove said conformal etch stop layer.

7. The method of claim 6, wherein performing said etching process to remove portions of said conformal protection layer also removes at least a portion of said patterned etch mask positioned above said first and second fins.

8. The method of claim 7 further comprising:
forming a gate structure around at least a portion of said upper portion of said first fin; and
forming a gate structure around at least a portion of said upper portion of said second fin.

9. The method of claim 1, wherein performing said at least said one third trench etching process through said patterned etch mask further comprises defining a lower portion of said first fin.

10. The method of claim 1, wherein leaving said second portions of said conformal protection layer adjacent said upper portion of said second fin and on said sidewalls of said second fin comprises:
prior to performing said at least said one third trench etching process, forming an NFET device etch mask that covers said PFET device and exposes said NFET device; and
performing said at least said one third trench etching process with said NFET device etch mask in position.

11. A method, comprising:
forming a patterned etch mask above a semiconductor substrate;
performing at least one first trench etching process through said patterned etch mask to define an upper portion of a first fin for an NFET device and an upper portion of a second fin for a PFET device;
performing a first conformal deposition process to form a conformal etch stop layer around said upper portion of both said first and second fins;
forming a PFET device etch mask that covers said NFET device and exposes said PFET device;
with said PFET device etch mask in position, performing at least one second trench etching process through said patterned etch mask to define a lower portion of said second fin and to remove portions of said conformal etch stop layer;
after performing said at least one second trench etching process, removing said PFET device etch mask;
performing a second conformal deposition process to form a conformal protection layer around said upper portion of said second fin, on sidewalls of said lower portion of said second fin and around said upper portion of said first fin;
forming an NFET device etch mask that covers said PFET device and exposes said NFET device; and
with said NFET device etch mask in position, performing at least one third trench etching process through said patterned etch mask to define a lower portion of said first fin and to remove portions of said conformal protection layer.

12. The method of claim 11, wherein said conformal etch stop layer is made of silicon dioxide and said conformal protection layer is made of silicon nitride.

13. The method of claim 11, wherein said upper portion of said second fin for said PFET device is comprised of a semiconductor material that is different than the semiconductor material of said substrate.

14. The method of claim 13, wherein said semiconductor substrate material is silicon and said upper portion of said second fin comprises a germanium-containing semiconductor material $Si_xGe_{(1-x)}$ (where x ranges from zero to about 0.9) or at least one III-V semiconductor material.

15. The method of claim 11, further comprising:
forming a gate structure around at least a portion of said upper portion of said first fin; and
forming a gate structure around at least a portion of said upper portion of said second fin.

16. A method, comprising:
forming a patterned etch mask above a semiconductor substrate;
performing at least one first trench etching process through said patterned etch mask to define an upper portion of a first fin for an NFET device and an upper portion of a second fin for a PFET device;
performing a first conformal deposition process to form a conformal etch stop layer around said upper portion of both said first and second fins;
forming a PFET device etch mask that covers said NFET device and exposes said PFET device;
with said PFET device etch mask in position, performing at least one second trench etching process through said patterned etch mask to define a lower portion of said second fin and to remove portions of said conformal etch stop layer;
after performing said at least one second trench etching process, removing said PFET device etch mask;
performing a second conformal deposition process to form a conformal protection layer around said upper portion of said second fin, on sidewalls of said lower portion of said second fin and around said upper portion of said first fin;
forming an NFET device etch mask that covers said PFET device and exposes said NFET device;
with said NFET device etch mask in position, performing at least one third trench etching process through said patterned etch mask to define a lower portion of said first fin and to remove portions of said conformal protection layer;
forming a layer of silicon dioxide so as to overfill trenches formed adjacent said first and second fins; and
with said layer of silicon dioxide in position, performing a steam densification anneal process with said conformal protection layer in position around said upper portion of said second fin and on said lower portion of said second fin.

17. The method of claim 16, further comprising:
performing a recess etching process on said layer of silicon dioxide such that it has a recessed upper surface that is at a level such that at least a portion of said upper portion of said first and second fins is positioned above said level of said recessed upper surface of said layer of silicon dioxide;
performing an etching process to remove portions of said conformal protection layer positioned above said recessed upper surface of said layer of silicon dioxide while using said conformal etch stop layer as an etch stop during said etching process; and
after removing said conformal protection layer, performing an etching process to remove said conformal etch stop layer.

18. The method of claim 17, wherein performing said etching process to remove portions of said conformal protection layer also removes at least a portion of said patterned etch mask positioned above said first and second fins.

19. The method of claim 18 further comprising:
   forming a gate structure around at least a portion of said upper portion of said first fin; and
   forming a gate structure around at least a portion of said upper portion of said second fin.

20. The method of claim 16, wherein said conformal etch stop layer is made of silicon dioxide and said conformal protection layer is made of silicon nitride.

21. The method of claim 16, wherein said upper portion of said second fin for said PFET device is comprised of a semiconductor material that is different than the semiconductor material of said substrate.

* * * * *